United States Patent
Soni et al.

(10) Patent No.: US 7,835,435 B2
(45) Date of Patent: Nov. 16, 2010

(54) TECHNIQUES FOR COMPRESSING DIFFERENTIAL SAMPLES OF BANDWIDTH-LIMITED DATA TO REDUCE BANDWIDTH AND POWER CONSUMPTION BY AN INTERFACE

(75) Inventors: Samir J. Soni, Gilbert, AZ (US); Pravin Pramakanthan, Chandler, AZ (US); Clive K. Tang, Chandler, AZ (US); Bing Xu, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 533 days.

(21) Appl. No.: 11/970,887

(22) Filed: Jan. 8, 2008

(65) Prior Publication Data

US 2009/0175360 A1 Jul. 9, 2009

(51) Int. Cl.
*H04B 1/66* (2006.01)
(52) U.S. Cl. .................. 375/240; 375/240.25; 375/244; 375/316
(58) Field of Classification Search .............. 375/240, 375/240.25, 244, 316
See application file for complete search history.

(56) References Cited

U.S. PATENT DOCUMENTS 5,978,651 A * 11/1999 Eto et al. ................. 348/14.13
6,560,497 B2 * 5/2003 Naruki et al. ............... 700/94
7,190,848 B2 * 3/2007 Yamada ..................... 382/299

OTHER PUBLICATIONS

Fogg, Andrew, DigRF Baseband/RF Digital Interface Specification, Logical, Electrical and Time Characteristics, EFPRS Version Version 1.2, 2002.

* cited by examiner

*Primary Examiner*—Ted M Wang
(74) *Attorney, Agent, or Firm*—Ingrassia, Fisher & Lorenz, P.C.

(57) ABSTRACT

Techniques and technologies are provided for compressing differential samples of bandwidth-limited data and coding the compressed differential samples to reduce bandwidth and power consumption when communicating bandwidth-limited data over a serial interface which couples one integrated circuit to another integrated circuit.

21 Claims, 14 Drawing Sheets

FIG. 9

| NUMBER OF DIFFERENTIAL SAMPLES | SYSTEM VARIABLES | | % BIT SAVINGS FOR SYSTEM VARIABLES | |
|---|---|---|---|---|
| | NUMBER OF THRESHOLDS | SPECIFIC THRESHOLD VALUES | WCDMA MODE | GSM/EDGE MODE |
| p=1 | #thrsh=3 | 1/2, 1/4, 1/64 | 1.67% | — |
| | #thrsh=3 | 1/2, 1/8, 1/64 | 2.89% | — |
| | #thrsh=6 | 1/2, 1/4, 1/8, 1/16, 1/32, 1/64 | 0.45% | — |
| p=2 | #thrsh=3 | 1/2, 1/4, 1/64 | 5.51% | 6.42% |
| | #thrsh=3 | 1/2, 1/8, 1/64 | 4.91% | 5.24% |
| | #thrsh=6 | 1/2, 1/4, 1/8, 1/16, 1/32, 1/64 | 5.40% | 3.92% |
| p=4 | #thrsh=3 | 1/2, 1/4, 1/64 | 7.84% | 9.95% |
| | #thrsh=3 | 1/2, 1/8, 1/64 | 5.85% | 7.61% |
| | #thrsh=6 | 1/2, 1/4, 1/8, 1/16, 1/32, 1/64 | 7.73% | 8.10% |
| p=8 | #thrsh=3 | 1/2, 1/4, 1/64 | 8.64% | 9.84% |
| | #thrsh=3 | 1/2, 1/8, 1/64 | 5.81% | 7.94% |
| | #thrsh=6 | 1/2, 1/4, 1/8, 1/16, 1/32, 1/64 | 8.29% | 8.53% |
| p=16 | #thrsh=3 | 1/2, 1/4, 1/64 | 8.34% | 7.95% |
| | #thrsh=3 | 1/2, 1/8, 1/64 | 5.89% | 7.32% |
| | #thrsh=6 | 1/2, 1/4, 1/8, 1/16, 1/32, 1/64 | 8.01% | 7.20% |
| p=32 | #thrsh=3 | 1/2, 1/4, 1/64 | — | 5.56% |
| | #thrsh=3 | 1/2, 1/8, 1/64 | — | 5.50% |
| | #thrsh=6 | 1/2, 1/4, 1/8, 1/16, 1/32, 1/64 | — | 5.58% |

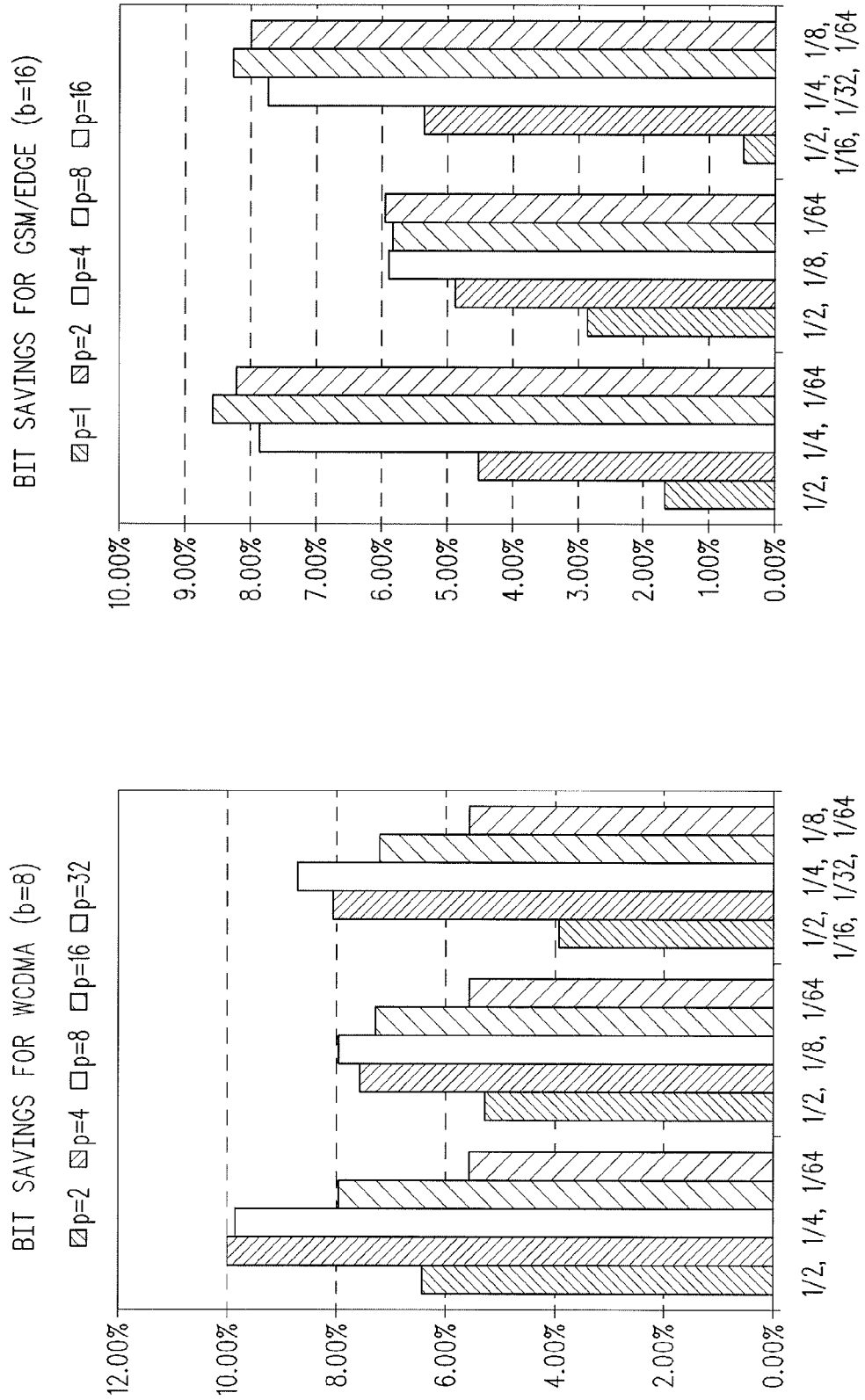

TECHNIQUES FOR COMPRESSING DIFFERENTIAL SAMPLES OF BANDWIDTH-LIMITED DATA TO REDUCE BANDWIDTH AND POWER CONSUMPTION BY AN INTERFACE

TECHNICAL FIELD

Embodiments of the subject matter described herein relate generally to data communications, and more particularly, to communication of bandwidth-limited data over a serial interface between a data source integrated circuit (IC) and a data sink IC.

BACKGROUND

When a real-time, digitized, bandwidth-limited signal is transmitted over a serial interface, it is desirable to improve operational speed of the interface and to reduce power consumption. This is especially true as bandwidth requirements increase.

Thus, it is desirable to provide techniques for high-speed data transfer over a serial interface without loss of information while reducing bandwidth utilization and power consumption of the serial interface. Furthermore, other desirable features and characteristics will become apparent from the subsequent detailed description and the appended claims, taken in conjunction with the accompanying drawings and the foregoing technical field and background.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 9 is a table of simulation results which illustrates the percentage of bit savings when different system variables are used in WCDMA operation mode and GSM/EDGE mode;

FIG. 10 is a bar graph which illustrates the simulation results of FIG. 9 for WCDMA operation mode; and FIG. 11 is a bar graph which illustrates other simulation results of FIG. 9 for GSM/EDGE operation mode.

DETAILED DESCRIPTION

Figure 1:
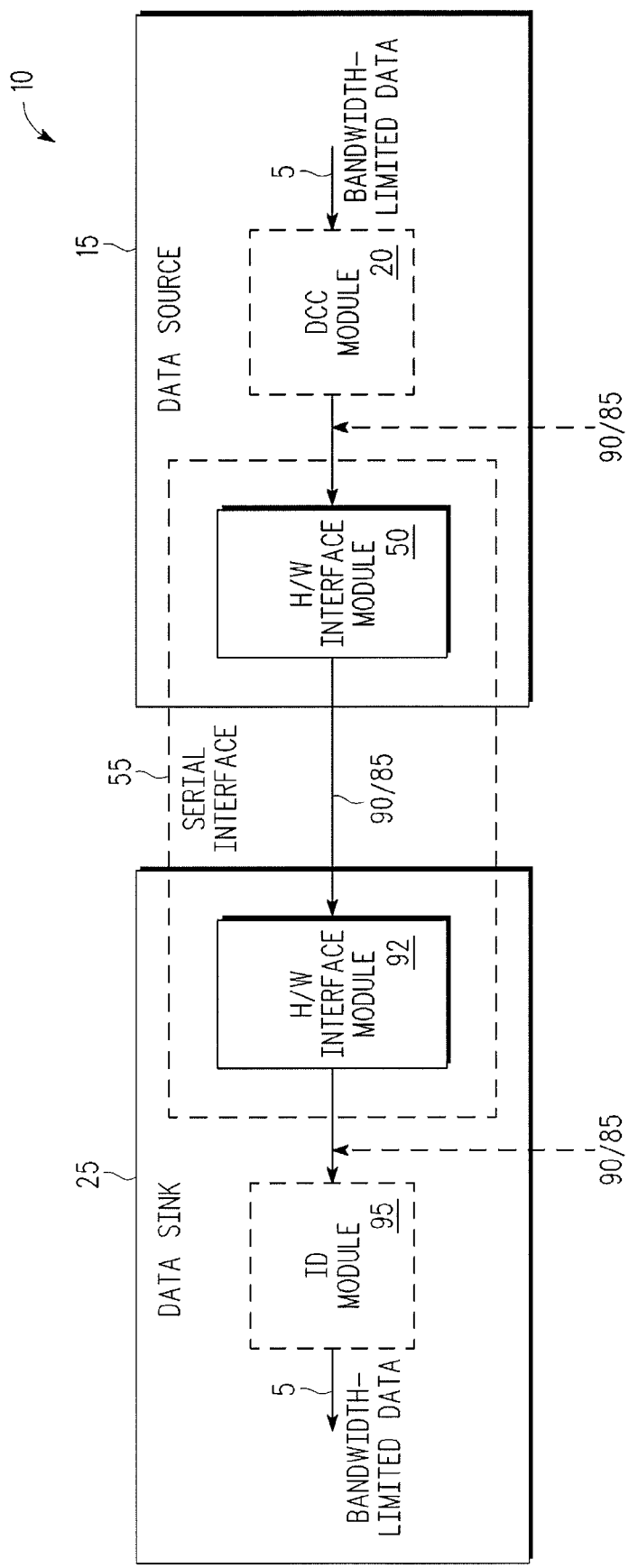
FIG. 1 is a block diagram which illustrates a communication system in accordance with an exemplary embodiment of the present invention.

The following detailed description is merely exemplary in nature and is not intended to limit the invention or the application and uses of the invention. The word "exemplary" is used herein to mean "serving as an example, instance, or illustration." Any embodiment described herein as "exemplary" is not necessarily to be construed as preferred or advantageous over other embodiments. All of the implementations described below are exemplary implementations provided to enable persons skilled in the art to make or use the invention and are not intended to limit the scope of the invention which is defined by the claims. Furthermore, there is no intention to be bound by any expressed or implied theory presented in the preceding technical field, background, brief summary or the following detailed description.

Techniques and technologies may be described herein in terms of functional and/or logical block components and various processing steps. It should be appreciated that such block components may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments described herein are merely exemplary implementations.

The connecting lines shown in the various figures contained herein are intended to represent example functional relationships and/or physical couplings between the various blocks, circuits, components, devices, elements or modules. It should be noted that many alternative or additional functional relationships or physical connections may be present in other embodiments of the subject matter. The following description refers to blocks, circuits, components, devices, elements or modules being "connected" or "coupled" together. As used herein, unless expressly stated otherwise, "connected" means that one block, circuit, component, device, element or module is directly joined to (or directly communicates with) another block, circuit, component, device, element or module, and not necessarily mechanically. Likewise, unless expressly stated otherwise, "coupled" means that one block, circuit, component, device, element or module is directly or indirectly joined to (or directly or indirectly communicates with) another block, circuit, component, device, element or module, and not necessarily mechanically. Thus, although the schematics illustrated in FIG. 1-7 depict exemplary arrangements, additional intervening blocks, circuits, components, devices, elements or modules may be present in embodiments of the depicted subject matter.

Terminology

As used herein, the term "bandwidth-limited data stream or signal" refers to a stream of data samples wherein the frequency content carried by the data stream is finite with respect to data rate. For instance, in one implementation, the Fast Fourier Transform (FFT) of a data stream samples will result in bandwidth limited response. The terms "bandwidth-limited data stream" and "bandwidth-limited data signal" are used interchangeably throughout this description.

As used herein, the term "frame" refers to a unit of data comprising either: a default bit code and a number (p) of raw data samples, or a particular compression bit code and a number (p) of compressed-differential samples of the raw data. The terms "frame" "packet" and "block" are used interchangeably throughout this description.

As used herein, the term "mode of operation" refers to a specific configuration of a data source IC and a data sink IC. The "mode of operation" can determine the data rate, data bandwidth and other system level requirements, such as the configuration and protocols the data source IC and data sink IC agree upon for data exchange. In some implementations, the modes of operation can include, for example, GSM/EDGE, WCDMA, LTE, 4G, etc. In a given mode of operation, values of variables, such as the number (p) of samples, the number (i) of differentiation modules, threshold values (threshold_1 . . . threshold_T), are predetermined based on the mode of operation.

As used herein, the term "representable" can be interpreted as meaning "capable of being represented" and/or "can be represented by." For instance, one exemplary usage of this term is that, a sample is "representable" using a number of bits.

Overview

In the exemplary embodiments which will now be described, techniques and technologies will be described for compressing differential samples of bandwidth-limited data and coding the compressed differential samples to reduce bandwidth and power consumption when communicating bandwidth-limited data over a serial interface which couples one integrated circuit to another integrated circuit. However, it will be appreciated by those skilled in the art that the same or similar techniques and technologies can be applied to other types of interfaces.

EXEMPLARY EMBODIMENTS

FIG. 1 is a block diagram which illustrates a communication system 10 in accordance with an exemplary embodiment of the present invention.

The communication system 10 comprises a data source IC 15, a serial interface 55, and a data sink IC 25. In this embodiment, the serial interface 55 includes the interface modules 50, 92 which enable communication between the data source IC 15 and the data sink IC 25. The data source IC 15 includes the interface module 50 and a differential compression coding (DCC) module 20 which receives a data stream 5 of n raw data samples and then generates, based on the bandwidth-limited data 5, a frame 85/90 comprising either (a) a frame 85 of the actual or "raw" samples of bandwidth-limited data 5 or (b) a frame 90 of compressed, differential samples of the bandwidth-limited data 5. In one implementation, the frame 85 comprises a default bit code ($bc_d$) and a number (p) of consecutive raw data samples of the raw data samples, where $p \leq n$. In one implementation, the frame 90 comprises a particular or specific compression bit code ($bc_t$) and a number (p) of consecutive compressed-differential samples which are generated based on at least some of the some of the raw data samples, where $p \leq n$.

The interface module 50 of the data source IC 15 communicates the frame 85 or 95 to the interface module 92 of data sink IC 25. The data sink IC 25 also includes an integration and decompression (ID) module 95. As will be described in greater detail below, upon receiving the frames 85/90 from the data source IC 15, the ID module 95 processes frames 85/90 to regenerate or extract the raw data samples of the bandwidth-limited data 5. For example, when the ID module 95 receives a frame 90, the ID module 95 performs decompression operations to reproduce the correct number of bits used to represent each of the differential samples, and then performs integration operations on the differential samples of the frame 90 to generate the actual samples of the original bandwidth-limited data 5.

Before describing processing performed by the DCC module 20 and the ID module 95 in more detail, an exemplary IC architecture will be now described below with reference to FIG. 2 to illustrate one example of an IC architecture in which the generalized architecture of FIG. 1 can be applied to I/Q samples of the bandwidth-limited data.

Figure 2:
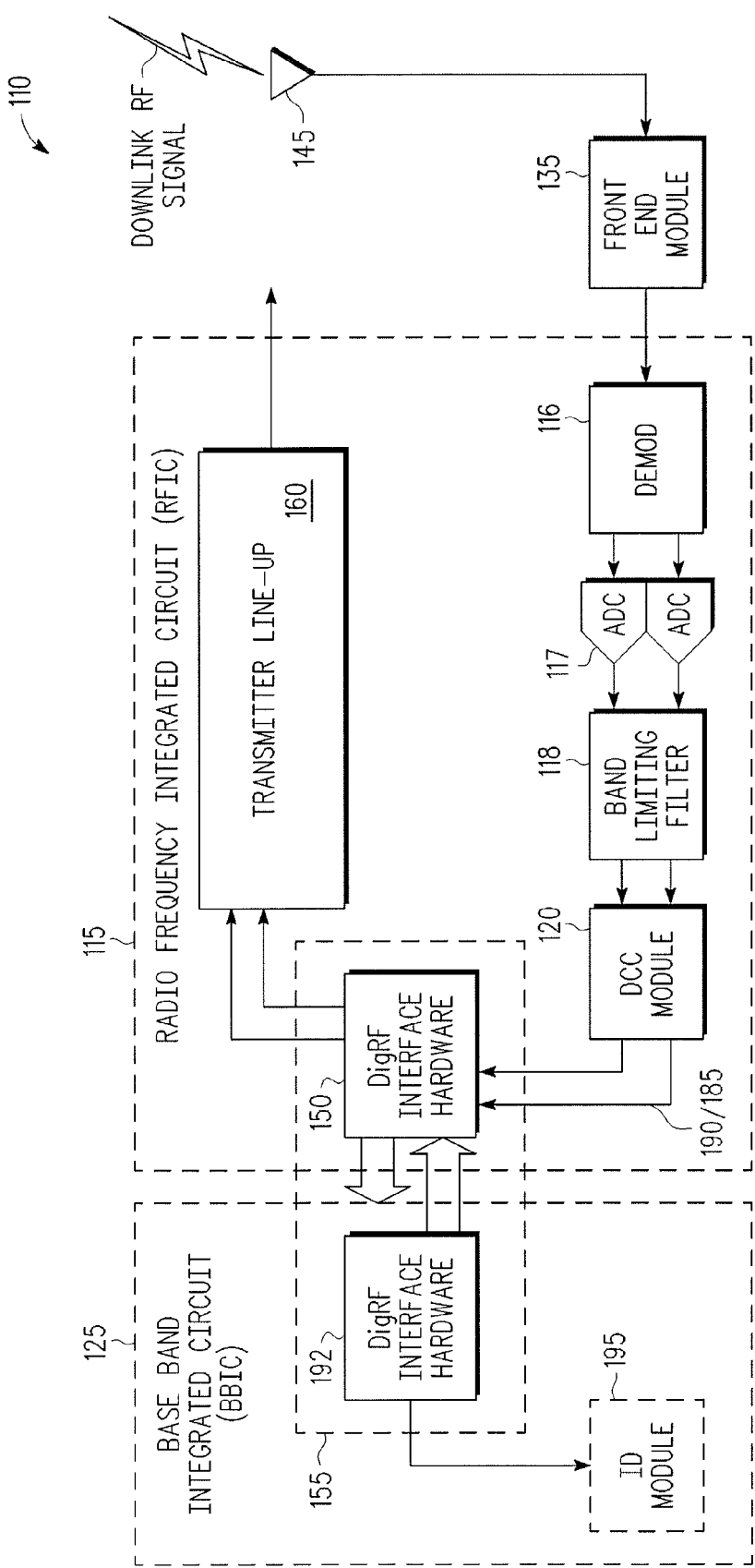
FIG. 2 is a block diagram which illustrates an exemplary receiver architecture of a wireless communication device in accordance with an exemplary embodiment of the present invention.

FIG. 2 is a block diagram which illustrates an exemplary receiver architecture 110 of a wireless communication device in accordance with an exemplary embodiment of the present invention. The receiver architecture 110 comprises an antenna 145 coupled to a front end module 135, a radio frequency integrated circuit (RFIC) 115 coupled to the front end module 135, a baseband integrated circuit (BBIC) 125, and an serial interface 155 which couples the RFIC 15 to the BBIC 115. As used herein, the term "radio frequency (RF)," refers to a frequency or rate of oscillation within the range of about 3 Hz and 300 GHz. This range corresponds to frequency of alternating current (AC) electrical signals used to generate, transmit, and detect radio waves. As used herein, the term "baseband," refers to signals in which a band or range of frequencies from 0 to highest signal frequency or a maximum bandwidth. The term baseband can be a synonym for lowpass, and an antonym for passband.

The disclosed techniques and technologies can be utilized for transmitting bandwidth-limited data over any serial interface including those used in conjunction with wireless communication standards such as GSM/EDGE, WCDMA, LTE, 4G, WiMAX, etc. One such serial interface is defined by the DigRF standard. In this implementation, the AS interface 155 includes DigRF interface hardware modules 150, 192 for communicating data between the RFIC 115 and the BBIC 125. In this implementation, the DCC module 120 can be implemented as part of or in conjunction with a high-speed asynchronous serial interface. In this implementation, the interface 155 is described as being compliant with the DigRF physical interface standard, which defines a digital serial interface that is implemented between a baseband IC (BBIC) 115 and a radio frequency IC (RFIC) 125 used in wireless communication devices. The DigRF standard is being developed by the DigRF working group under MIPI alliances. The DigRF standard places few constraints on the internal architectures of the ICs, and allows for any combination of supporting chip sets, and supports a variety of third Generation Partnership Project (3GPP) and third Generation Partnership Project 2 (3GPP2) standards. 3GPP-based standards such as GSM, EDGE, CDMA, WCDMA, LTE, UMTS, WiMax, IEEE 802.16, IEEE 802.20 and IEEE 802.11a/b/g. The asynchronous, digital serial interface specified by the DigRF standard replaces analog interfaces used in previous generations of wireless communication device architectures and eliminates the need for intermediate mixed signal devices. The DigRF standard defines an efficient physical interconnection between the RFIC and BBIC which allows the RFIC and the BBIC to communicate directly with each other. Among other things, the DigRF standard describes or will describe the logical, electrical and timing characteristics of the digital interface with sufficient detail to allow physical implementation of the interface, and with sufficient rigor that implementations of the interface from different suppliers are fully compatible at the physical level.

When the antenna 45 receives a complex radio frequency (RF) signal, the antenna 45 passes the complex RF signal to the front end module 135, which in turn communicates the RF signal to a demodulator 116. The complex RF signal can sometimes be referred to as an incoming or "downlink" RF signal. The demodulator 116 demodulates the complex RF signal and outputs analog I channel signals to one of the analog-to-digital converters 117 and analog Q channel signals to the other one of the analog-to-digital converters 117. Based on the analog I and Q channel signals, one of the analog-to-digital converter 117 outputs a digital I channel signal, and the other analog-to-digital converter 117 outputs a digital Q channel signal, respectively.

The bandwidth-limiting filter 118 receives the digital I/Q channel signals and filters the digital I/Q channel signals to limit the bandwidth of the digital I/Q channel signals The bandwidth-limiting filter 118 outputs digital samples 105 of bandwidth-limited I channel data, and samples of bandwidth-limited Q channel data. After extracting I channel data and Q channel data samples 105, referred to herein as raw, bandwidth limited I/Q data samples, from the incoming radio frequency (RF) signal, the bandwidth-limiting filter 118 communicates the data stream of raw, bandwidth-limited I/Q data samples 105 to the DCC module 120.

As will be described below, for example, with reference to FIGS. 3-7, the DCC module 120 implements techniques for compressing the raw, bandwidth-limited I/Q data samples 105 before transmitting them over the serial interface 155 to reduce bandwidth and power when transmitting the raw, bandwidth-limited I/Q data samples 105 over the serial interface 155. It is to be appreciated that although the DCC module 120 is illustrated as a pre-processing module that is implemented before the DigRF interface hardware module 150 of the serial interface 155 in the implementation illustrated in FIG. 2, in other implementations, the DCC module 120 can be implemented as part of the DigRF interface hardware module 150.

Figure 3:
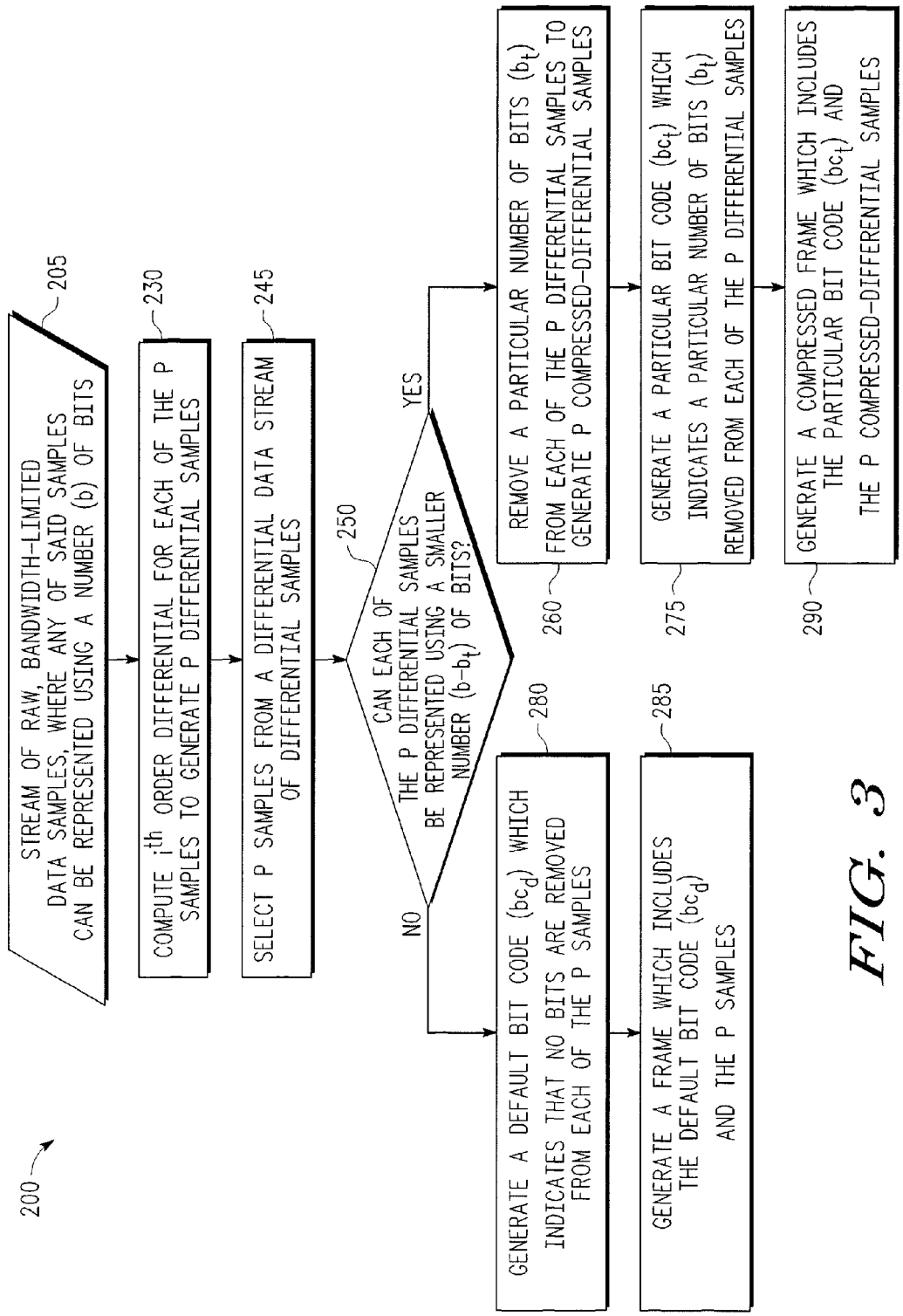
FIG. 3 is a flow chart which illustrates a method for compressing differential samples of bandwidth-limited data and coding the compressed differential samples in accordance with an exemplary embodiment of the present invention.

FIG. 3 is a flow chart which illustrates a method 200 for compressing differential samples of bandwidth-limited data and coding the compressed differential samples in accordance with an exemplary embodiment of the present invention. For purposes of illustration, method 200 will be explained below with reference to the communication system 10 illustrated in FIG. 1; however, method 200 can also be applied in the context of other systems in which bandwidth-limited data samples are processed for transmission over a serial interface.

Block 205 illustrates a data stream 5 of raw, bandwidth-limited data samples (1 . . . n). The individual samples of the bandwidth-limited data stream 5 each require a certain number of bits to represent the value of those samples. As such, any of the raw data samples requires, at most, some maximum number (b) of bits to represent its value. In other words, "b" is total number of bits required to represent each raw data sample of the data stream 5.

When the DCC module 20 receives samples of the bandwidth-limited data 5, at step 230, the DCC module 20 performs one or more differentiation operations on each of the raw data samples to generate or compute "differential samples" based on the raw, bandwidth-limited data samples. This results in differential data stream of $i^{th}$ order differential samples.

At step 245, the DCC module 20 selects a number (p) of $i^{th}$ order differential samples of the differential data stream for further processing. Here, p represents a number of consecutive raw data samples selected for further processing, where $p \leq n$.

At step 250, the DCC module 20 then determines whether the number (p) of $i^{th}$ order differential samples can be represented using a fewer number of bits ($b-b_t$) than the maximum number (b) of bits required to represent corresponding samples of the bandwidth-limited data 5.

When the number (p) of $i^{th}$ order differential samples can be represented using a fewer number of bits ($b-b_t$) than the maximum number (b) of bits required to represent corresponding raw data samples of the bandwidth-limited data 5, then at step 260, the DCC module 20 compresses or "trims" each of the number (p) of $i^{th}$ order differential samples by removing the number of bits ($b_t$) from each differential sample to produce a compressed representation of the number (p) of $i^{th}$ order differential samples. At step 275, the DCC module 20 generates a specific compression bit code ($bc_t$) which indicates the number of bits ($b_s$) to be removed or trimmed from each differential sample. At step 290, the DCC module 20 generates a compressed frame 90 based on the compressed representation of the differential samples and attaches the specific compression bit code ($bc_t$) to the frame 90.

By contrast, when the one or more of $i^{th}$ order differential samples can not be represented using a fewer number of bits ($b-b_t$) than the maximum number (b) of bits required to represent corresponding raw data samples of the bandwidth-limited data 5, then at step 280, the DCC module 20 generates a default bit code ($bc_d$) which indicates that no bits are removed or trimmed from the raw data samples of the bandwidth-limited data 5. At step 285, the DCC module 20 generates a frame 85 using the raw data samples of the bandwidth-limited data 5 and attaches the default bit code ($bc_d$) as part of the frame 85.

Figure 4:
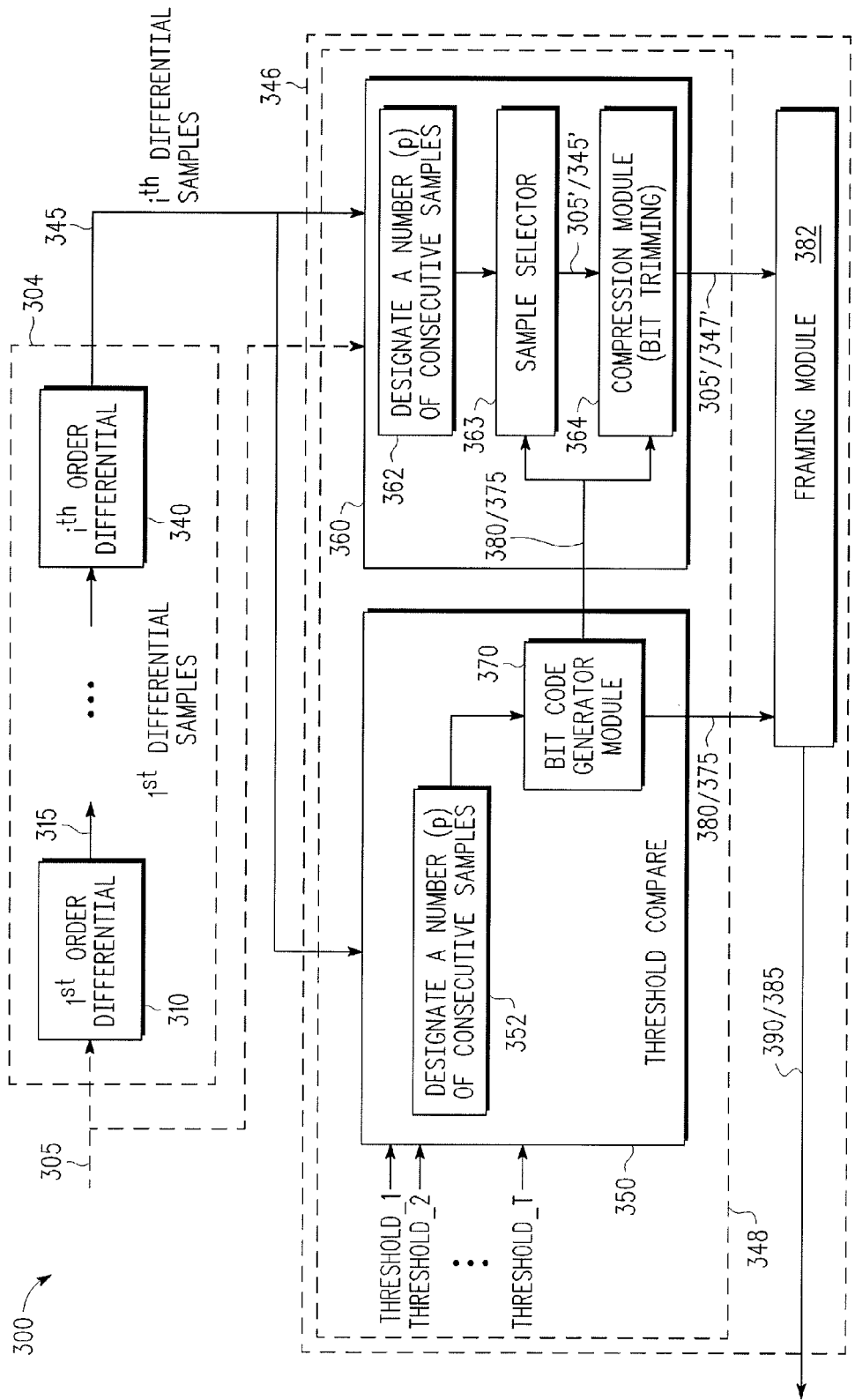
FIG. 4 is block diagram which illustrates a DCC module in accordance with an exemplary embodiment of the present invention.
Figure 5:
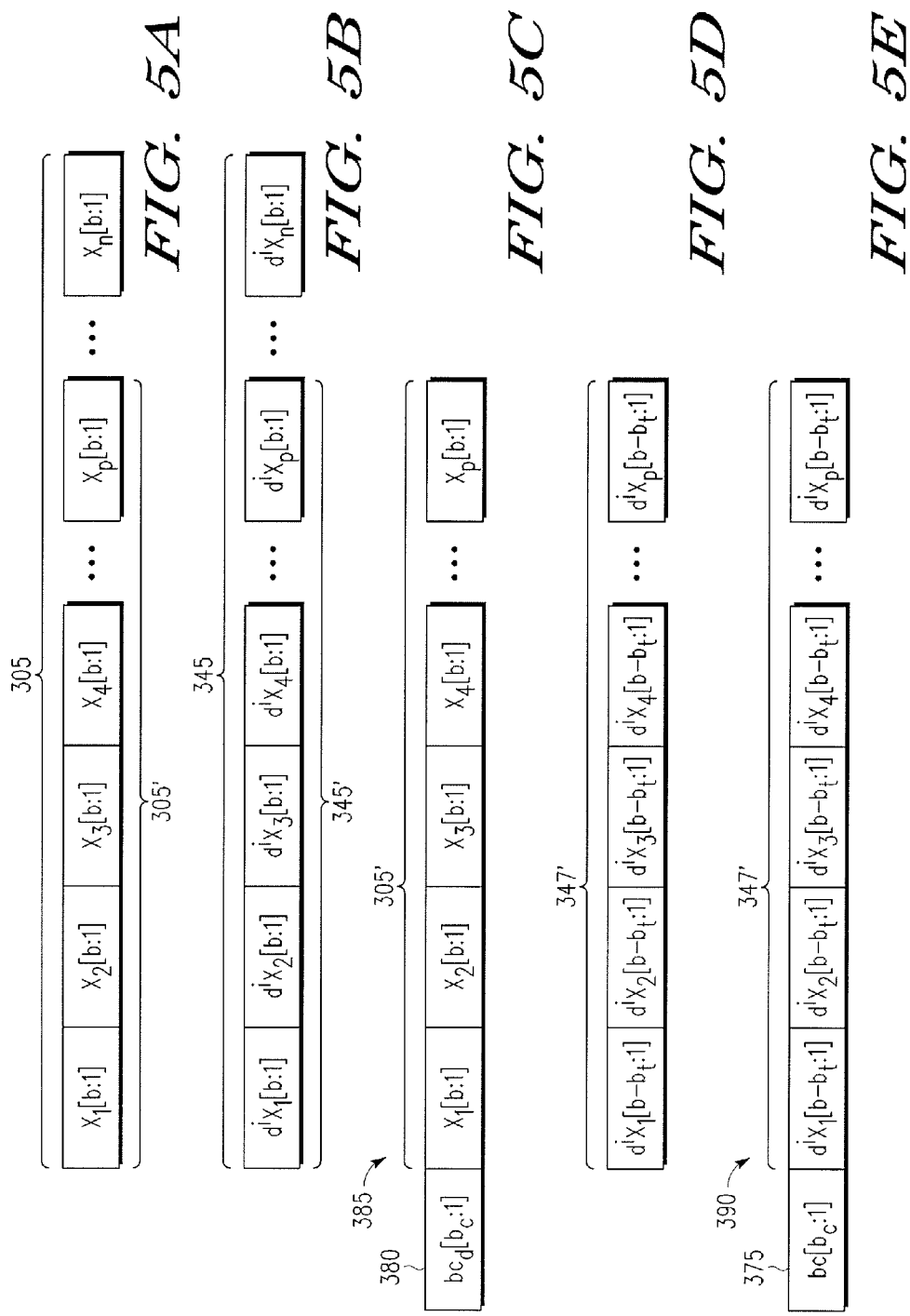
FIG. 5A illustrates an exemplary bandwidth-limited data stream including a number (n) of raw data samples.
FIG. 5B illustrates a differential data stream where each block represents a differential sample that corresponds to one of the number (n) of the raw data samples in FIG. 5A in accordance with an exemplary embodiment of the present invention.
FIG. 5C illustrates a frame which includes a default bit code ($bc_d$) and a number (p) of consecutive raw data samples from FIG. 5A in accordance with an exemplary embodiment of the present invention.
FIG. 5D illustrates p consecutive compressed-differential samples in accordance with an exemplary embodiment of the present invention.
FIG. 5E illustrates a compressed frame which includes a specific compression bit code ($bc_t$) and a number (p) of consecutive compressed-differential samples in accordance with an exemplary embodiment of the present invention.

FIG. 4 is block diagram which illustrates a DCC module 300 in accordance with an exemplary embodiment of the present invention. As noted above, in some embodiments, the DCC module 300 can be implemented as a pre-processing module in conjunction with an serial interface, while in other embodiments, the DCC module 300 can be implemented as part of a serial interface. The DCC module 300 comprises a differential computation module 304 and a dynamic compression and coding module 346. FIG. 4 will be described with reference to FIGS. 5A-5E. FIGS. 5A-5E represent data streams 305, 345, 385, 347', 390, generated at various locations in the DCC module 300. In FIGS. 5A-5E, the notation "sig[x:y]" means that the value of variable 'sig' is represented using (x−y+1) total bits and all these bits are numbered y through x (in increasing order). This notation represents a standard notation for designating signals which comprise more than one wire presentation to a hardware interface.

Differential Computation

The differential computation module 304 receives n raw data samples (1 . . . n) of a bandwidth-limited data stream 305 from a data source, such as the data source IC 15 of FIG. 1 or the band-limiting filter 118 of FIG. 2. An example of a bandwidth-limited data stream 305 is illustrated in FIG. 5A, where each block ($X_1 \ldots X_n$) represents a raw data sample (1 . . . n), and the notation $X_1[b:1]$ means that the value of sample $X_1$ is represented using (b−1+1) total bits (or "b" total bits) and that the b bits are numbered 1 through b in increasing order.

Based on the n raw data samples (1 . . . n) of the bandwidth-limited data stream 305, the differential computation module 304 computes the first . . . $i^{th}$ order differential samples corresponding to the raw data samples of the bandwidth-limited data stream 305 to generate a differential data stream 345 of n $i^{th}$ order differential samples. An example of the differential data stream 345 is illustrated in FIG. 5B, where each block represents a differential sample, and the wherein notation $d^i X_1[b:1]$ means that the value of variable $d^i X_1$ is represented using (b−1+1) total bits numbered 1 through b in increasing order.

The differential computation module 304 includes at least one differentiator module (e.g., when i is equal to 1), but more than one differentiator module or multiple differentiator modules (e.g., $i \geq 1$) can be implemented in other implementations which depend, for example, on the mode of operation and characteristics of the bandwidth-limited data stream 305 (e.g., the sampling rate to bandwidth relationship of the bandwidth-limited data stream 305). In this exemplary implementation, the differential computation module 304 comprises a first differentiator module 310 through an $i^{th}$ differentiator module 340, where $i \geq 1$.

The first differentiator module 310 receives the raw data samples (1 . . . n) of the bandwidth-limited data stream 305, and generates or computes a first order differential data stream 315 of first order differential samples by computing a first order differentials corresponding to each of the raw data samples (1 . . . n) of the data stream 305. For instance, with respect to a raw data sample ($I_{j+1}$) the first differentiator module 310 can calculate a first order differential sample $d^1 I_{j+1} = I_{j+1} - I_j$, where $I_{j+1}$ represents a raw data sample of the bandwidth-limited data stream 305, $I_j$ represents a prior raw data sample of the bandwidth-limited data stream 305, and $d^1 I_{j+1}$ represents the first order differential sample. The first differentiator module 310 communicates each of the first order differential samples 315 to the $i^{th}$ differentiator module 340.

The $i^{th}$ differentiator module 340 receives the first order differential data stream 315 of first differential samples (or alternatively $(i-1)^{th}$ order differential data stream 315 of $(i-1)^{th}$ differential samples if more differentiator modules are implemented between first differentiator module 310 and the $i^{th}$ differentiator module 340), and generates or computes an $i^{th}$ order differential data stream 345 of $i^{th}$ order differential samples by computing $i^{th}$ order differentials corresponding to each of the first differential samples. For instance, the $i^{th}$ differentiator module 340 can calculate an $i^{th}$ order differential sample $d^i I_{j+1} = d^{(i-1)} I_{j+1} - d^{(i-1)} I_j$, where $d^i I_{j+1}$ represents an $i^{th}$ order differential sample, where $d^{(i-1)} I_j$ represents a prior differential sample, and where $d^{(i-1)} I_{j+1}$ represents the $i^{th}$ order differential sample.

As described below, for a given amount of raw data samples of the bandwidth-limited data stream 305, the distribution of values of the $i^{th}$ order differential samples 345 is more "Gaussian" than the distribution of values of the raw data samples of the bandwidth-limited data stream 305, the first order differential samples 315 of the bandwidth-limited data signal (or the $(i-1)^{th}$ differential samples when more than two differentiator modules are implemented). As used herein, and as will be described in more detail below, the term "Gaussian," when used in conjunction with the term distribution, refers to an approximately normal distribution which has a probability density similar to the shape of a bell.

Raw data samples of the bandwidth-limited data stream 305 have values which range between a maximum value (+MAX) and a minimum value (−MAX). The variable b represents the number (b) of bits are required to represent the maximum value of any raw data sample that are within the range 2MAX. In other words, the variable b is the maximum number of bits required to represent any raw data sample of the bandwidth-limited data stream 305. Because the data stream 305 is "bandwidth-limited," the likelihood that values of the raw data samples will vary outside the range (i.e., between the maximum value (+MAX) and the minimum value (−MAX)) from one sample to the next is relatively small. Because the difference between any two consecutive $i^{th}$ order differential samples 345 is smaller than the difference between any two consecutive first order differential samples 315, a lesser number of bits (b−$b_t$) are required to represent the $i^{th}$ order differential samples 345. For instance, in comparison to $(i-1)^{st}$ order differential samples (not illustrated in FIG. 4), a larger percentage of $i^{th}$ order differential samples 345 can be represented with (b−1) bits. The same concept applies for (b−2), (b−3), etc. As used herein, the term "smaller sample values" is used to refer to sample values which can be represented using a smaller number of bits relative to "larger sample values." Because the probability of having smaller values of differential samples 345 as compared to differential samples 315, many more samples at 345 could be represented with a lesser number of bits (b−$b_t$).

Thus, in some scenarios, the $i^{th}$ order differential samples 345 can be represented using with lesser number of bits (b−$b_t$) in comparison to the raw data samples of the bandwidth-limited data stream 305, the first order differential samples of the bandwidth-limited data stream 305, the $(i-1)^{th}$ differential of those samples, etc.

Dynamic Compression and Coding

By generating the $i^{th}$ order differential samples 345, the dynamic compression and coding module 346 can reduce the number of bits required to represent the respective values of most of the raw data samples 305 so that the number of bits required to represent each of the differential samples 345 can subsequently be reduced by a number ($b_t$) of bits.

The dynamic compression and coding module 346 applies dynamic compression techniques to reduce or trim the number (b) of bits required to represent each raw sample 305 to generate compressed-differential samples 347' of the raw data samples (1 ... n). The dynamic compression and coding module 346 also applies the dynamic coding techniques to generate additional bit coding (bc) information to be included along with the compressed-differential samples 347' such that the compressed-differential samples 347' can be decompressed at the receiver.

In the exemplary implementation illustrated in FIG. 4, the dynamic compression and coding module 346 comprises a threshold comparator module 350, a sample selector and bit trimming module 360, a bit code generator module 370, and a framing module 382.

The dynamic compression and coding module 346 receives the data stream 305 of raw, bandwidth-limited data samples (1 ... n) and the differential data stream 345 of $i^{th}$ order differential samples which are generated by the differential computation module 304 based on the raw, bandwidth-limited data samples (1 ... n).

The threshold comparator module 350 comprises a module 352 for designating a number (p) of consecutive $i^{th}$ order differential samples 345 for comparison to various threshold values (threshold_1 ... threshold_T). The exemplary embodiment illustrated in FIG. 4 illustrates that the threshold comparator module 350 receives a plurality of threshold values (threshold_1 ... threshold_T), where T is the total number of threshold values chosen for a particular implementation. The choice of threshold values (threshold_1 ... threshold_T) varies depending on the particular implementation, and different threshold values (threshold_1 ... threshold_T) can be selected depending on the mode of operation. When the values of the raw data samples (1 ... n) are normally represented with b bits, the plurality of threshold values (threshold_1 ... threshold_T) can be selected such that when the values of the $i^{th}$ order differential samples of the differential data stream 345 are less than a particular one of the thresholds, then the data can be represented with $b-b_t$ bits, where $b_t$ is an integer. In one implementation, the threshold values (threshold_1 ... threshold_T) range between $(½)^n$, wherein n=1 ... 8 such that the threshold values (threshold_1 ... threshold_T) can represent any of ½, ¼th, ⅛th, ⅟₁₆th, ⅟₃₂nd, ⅟₆₄th of the range (i.e., difference between the maximum value (+MAX) and the minimum value (−MAX)) of the number of bits used to represent the raw data samples (1 ... n) of the bandwidth-limited data stream 305. In other implementations, the threshold values (threshold_1 ... threshold_T) can be any combination of the values $(½)^n$.

The threshold comparator module 350 includes a module 352 for designating a number (p) of consecutive $i^{th}$ order differential samples 345 to be compared against each of the threshold values (threshold_1 ... threshold_T). The value p can be predetermined based on the mode of operation (e.g., mode of operation could be GSM/EDGE, WCDMA, LTE, 4G etc). The value of p also depends on the probability of having one larger value within so many consecutive samples. These values can be determined by simulations or other means.

The threshold comparator module 350 compares each of the p consecutive $i^{th}$ order differential samples 345 against each of a plurality of threshold values (threshold_1 ... threshold_T) to determine if each of the p consecutive $i^{th}$ order differential samples 345 can be fit within a certain one of the threshold values (threshold_1 ... threshold_T) without any loss. This way, the threshold comparator module 350 can dynamically determine whether bit savings can be achieved by compressing the p consecutive $i^{th}$ order differential samples 345 thereby reducing overhead.

If the threshold comparator module 350 determines that compressing the p consecutive $i^{th}$ order differential samples 345 is possible (and hence that bit savings can be increased), the threshold comparator module 350 communicates the threshold comparison output to the bit code generator module 370, which generates a specific compression bit code ($bc_t$) 375 for threshold t, where t is the smallest threshold value (out of the threshold_1, threshold_2, ... threshold_T) for which all of the p consecutive $i^{th}$ order differential samples 345' are smaller than threshold t. The specific compression bit code ($bc_t$) 375 indicates that the p consecutive $i^{th}$ order differential samples 345' can be compressed. The threshold comparator module 350 communicates the specific compression bit code ($bc_t$) 375 to the sample selector and bit trimming module 360 and the framing module 382.

As described below, the compression module 364 selects the p consecutive $i^{th}$ order differential samples 345' and determines how many bits are to be removed or "trimmed" from each of the p consecutive $i^{th}$ order differential samples 345' to generate the number (p) of consecutive compressed-differential samples 347'.

If the threshold comparator module 350 determines that compressing the p consecutive $i^{th}$ order differential samples 345 is not possible (and hence that bit savings can not be increased by compression of the samples 345), the bit code generator module 370 generates a default bit code ($bc_d$) 380. In other words, when the threshold comparator module 350 determines that one or more of the p consecutive $i^{th}$ order differential samples 345' are not smaller than any of the threshold values (threshold_1 ... threshold_T), the threshold comparator module 350 generates the default bit code ($bc_d$) 380 which indicates that the p consecutive $i^{th}$ order differential samples 345' can not be compressed and therefore bit savings can not be increased by compressing the p consecutive $i^{th}$ order differential samples 345'. The threshold comparator module 350 communicates the default bit code ($bc_d$) 380 to the sample selector and bit trimming module 360 and the framing module 382. As described below, in response to the threshold comparison output, the compression module 364 selects the number (p) of consecutive raw data samples 305' and does not perform any compression. FIG. 5A illustrates the number (p) of consecutive raw data samples 305'.

As described above, the bit code generator module 370 generates an appropriate bit code 375, 380 based on the result of the threshold comparison output, 355. In one scenario, a specific compression bit code ($bc_t$) 375 for threshold t is generated, and in another scenario, a default bit code ($bc_d$) 380 is generated which indicates "raw data" is selected and that no compression is to be performed on the number (p) of consecutive raw data samples 305'. For example, if all of the p of consecutive $i^{th}$ order differential samples 362 are smaller than a particular threshold values (threshold_1 ... threshold_T), the bit code generator module 370 generates an appropriate specific compression bit code ($bc_t$) 375 which indicates the smallest threshold t (out of threshold_1, threshold_2, ... threshold_T) for which all of the p consecutive $i^{th}$ order differential samples 345' are smaller than threshold t). The value of the specific compression bit code ($bc_t$) 375 for threshold t depends on the number of threshold values used by the threshold comparator module 350, and for a selected number of different threshold values there will be $2^{bc}$ possible bit codes, where bc is $\log_2(T+1)$ bits required to represent all possible bc codes. On the other hand, if any of the p consecutive $i^{th}$ order differential samples 345' are greater than or equal to the largest threshold value amongst the selected threshold values (threshold_1 ... threshold_T) used by the threshold comparator module 350 (i.e., if any of the p samples can not be fit within the threshold values (threshold_1 ... threshold_T)), the bit code generator module 370 generates the default bit code (bc$_d$) 380 that indicates that no bit savings are possible.

The sample selector module 363 selects either: (a) the p consecutive i$^{th}$ order differential samples 345' of the raw data samples (1 . . . n) for transmission (instead of the number (p) of consecutive raw data samples 305'), or (b) the number (p) of consecutive raw data samples 305' (as illustrated in FIG. 5A), for framing by the framing module 382.

Based on the threshold comparison output, the sample selector module 363 designates either: a number (p) of consecutive i$^{th}$ order differential samples 345' which correspond to p consecutive raw data samples of the bandwidth-limited data stream 305, or a number (p) of consecutive raw data samples 305' for transmission. When the p consecutive i$^{th}$ order differential samples 345' are selected, the compression module 364 performs bit trimming on the number (p) of consecutive i$^{th}$ order differential samples 345'. The compression module 364 outputs either the selected one of the number (p) of consecutive compressed-differential samples 347' or the number (p) of the raw data samples (1 . . . n) 305'.

When the selector module 363 selects the p consecutive i$^{th}$ order differential samples 345', the compression module 364 performs bit trimming on the number (p) of consecutive i$^{th}$ order differential samples 345' to generate a number (p) of consecutive compressed-differential samples 347'. An example of the p consecutive compressed-differential samples 347' is illustrated in FIG. 5D, where each block represents a compressed-differential sample, and the notation d$^i$X$_1$[b−b$_t$:1] means that the value of the i$^{th}$ order differential of variable 'X$_1$' is represented using (b−b$_t$) total bits. As illustrated in FIG. 5D, the p consecutive compressed-differential samples 347' are compressed versions of each block of 345' of FIG. 5B.

Depending on whether the specific compression bit code (bc$_t$) 375 or default bit code (bc$_d$) 380 is provided to the framing module 382, the framing module 382 generates either a frame 385 comprising default bit code (bc$_d$) 380 and a number (p) of consecutive raw data samples 305', or a frame 390 comprising a particular or specific compression bit code (bc$_t$) 370 and the number (p) of consecutive compressed-differential samples 347'.

For example, when the specific compression bit code (bc$_t$) 375 for threshold t is provided to the framing module 382, the framing module 382 generates the frame 390. As illustrated in FIG. 5E, frame 390 includes the specific compression bit code (bc$_t$) 375 and the number (p) of consecutive compressed-differential samples 347' as illustrated in FIG. 5B. The number (p) of consecutive compressed-differential samples 347' includes only b−b$_t$ least significant bits (LSBs) for each of the p values. Each block (except for the specific compression bit code (bc$_t$) 375) represents a compressed-differential sample of FIG. 5D. By contrast, when the framing module 382 receives the default bit code (bc$_d$) 380, which indicates 'raw data' and no compression, the framing module 382 generates frame 385. As illustrated in FIG. 5C, the frame 385 includes the default bit code (bc$_d$) 380 and the number (p) of consecutive raw data samples 305'. Each block (except for the default bit code (bc$_d$) 380) represents a raw data sample (1 . . . p) of FIG. 5A.

When a data sink IC (e.g., data sink 25 of FIG. 1 or BBIC 125 of FIG. 2) receives frame 390, the data sink IC samples the number (p) of consecutive compressed-differential samples 347' with the correct bit size and reconstructs samples of the bandwidth-limited data stream 305 using i$^{th}$ order integration, where the variable i determined based on the mode of operation. The data sink IC has the values of p, i, and b for the particular mode of operation. The data sink IC knows the number (p) of consecutive raw data samples 305', and the total number of bits (b) required to represent each sample. The data sink IC then extracts or reconstructs the original data of the raw, bandwidth-limited data samples (1 . . . p) by calculating an i$^{th}$ integral of the number (p) of consecutive i$^{th}$ order differential samples 345'. In other words, the data sink IC can reconstruct the original raw data samples (1 . . . n) 305 by performing an i$^{th}$ order integration to calculate a value of each data sample I$_{j+1}$=d$^i$I$_{j+1}$+I$_j$.

When the data sink IC receives the frame 385, the data sink IC uses the default bit code (bc$_d$) 380 to determine that the frame 385 has not been compressed.

Figure 6:
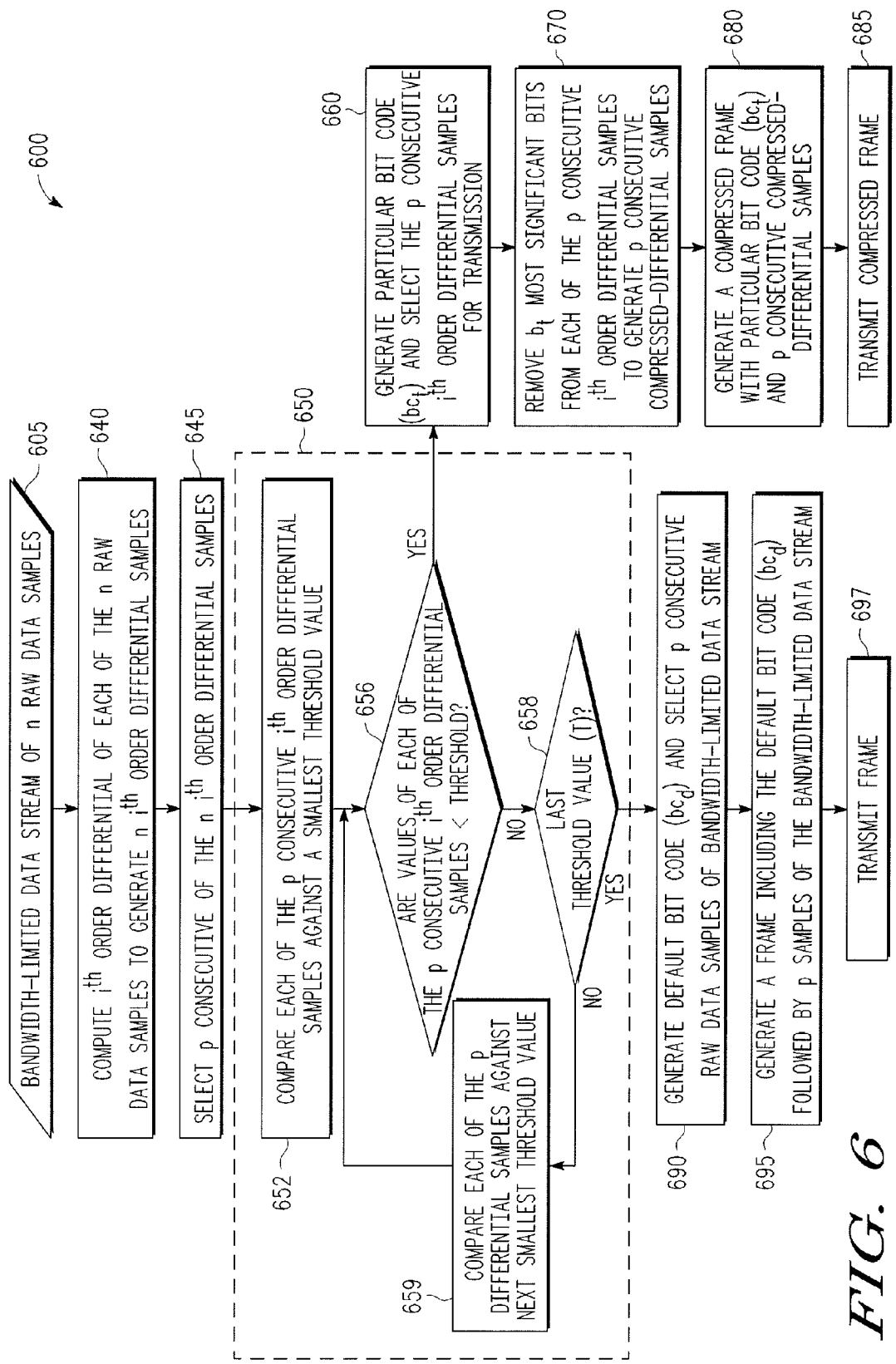
FIG. 6 is a flow chart which illustrates a method for compressing differential samples of bandwidth-limited data and coding the compressed differential samples in accordance with another exemplary embodiment of the present invention.

FIG. 6 is a flow chart which illustrates a method 600 for compressing differential samples of bandwidth-limited data and coding the compressed differential samples in accordance with an exemplary embodiment of the present invention. The method 600 can be implemented for differential computation, dynamic compression and bit coding data to be transmitted over an serial interface, while in other embodiments, the method 600 can be implemented in a serial interface for differential computation, dynamic compression and bit coding. For purposes of illustration, method 600 will be explained below with reference to the DCC module 300 illustrated in FIG. 4; however, method 300 can also be applied in the context of other systems in which bandwidth-limited differential samples data are compressed and in which the compressed differential samples are coded for transmission over a serial interface.

In the method, block 605 represents a bandwidth-limited data stream 605 which comprises n raw data samples (1 . . . n).

At step 640, based on the n raw data samples (1 . . . n) of the bandwidth-limited data stream 305, first . . . i$^{th}$ order differential samples corresponding to the n raw data samples (1 . . . n) are computed to generate a differential data stream 345 of n i$^{th}$ order differential samples.

At step 645, a number (p) of consecutive i$^{th}$ order differential samples 345 are selected for comparison to various threshold values (threshold_1 . . . threshold_T), where p≦n. The value p can be predetermined based on the mode of operation (e.g., mode of operation could be GSM/EDGE, WCDMA, LTE, 4G etc). The value of p also depends on the probability of having one larger value within so many consecutive samples. These values can be determined by simulations or other means. Although not shown, a number of threshold values (threshold_1 . . . threshold_T) have been specified or selected depending on the mode of operation. As described below, the plurality of threshold values (threshold_1 . . . threshold_T) can be selected such that when the values of each of the p i$^{th}$ order differential samples are less than a particular one of the threshold values (threshold_1 . . . threshold_T), the number (p) of consecutive i$^{th}$ order differential samples 345 can be represented with b−b$_t$ bits, where b is the number of bits used to represent the value of any of the raw data samples (1 . . . p) and b$_t$ is an integer number of bits to be trimmed from each of the p raw data samples (1 . . . p).

At step 650, it is determined whether the number of bits required to represent each of the p i$^{th}$ order differential samples 345 can be subsequently reduced by a number (b$_t$) of bits with respect to the number of bits required to represent the corresponding values of each of the p raw data samples 305. In other words, step 650 dynamically determines whether bit savings can be achieved by compressing the p consecutive i$^{th}$ order differential samples 345 thereby reducing overhead. In this implementation, step 650 will be described with reference to steps 652-658. At step 652, the number (p) of consecutive $i^{th}$ order differential samples 345 are compared to a smallest threshold value (threshold t) of the various threshold values (threshold_1 ... threshold_T).

At step 652, each of the p consecutive $i^{th}$ order differential samples 345 are compared against the smallest one of the plurality of threshold values (threshold_1 ... threshold_T) to determine if each of the p consecutive $i^{th}$ order differential samples 345 can be fit within a certain one of the threshold values (threshold_1 ... threshold_T) without any loss. At step 656, it is determined whether each of the p consecutive $i^{th}$ order differential samples 345 is less than a current threshold value, which in the first iteration of step 656 is the smallest threshold value, threshold_1. If one or more of the p consecutive $i^{th}$ order differential samples 345 is greater than or equal to the current threshold value (threshold_1), then method 600 proceeds to step 658, where it is determined whether the current threshold value (threshold_1) used at step 656 is the last threshold value (threshold_T).

If the current threshold value (threshold_1) used at step 656 is not the last threshold value (threshold_T), then the method 600 proceeds to step 659, where the number (p) of consecutive $i^{th}$ order differential samples 345 are compared to the next threshold value (threshold_2) of the various threshold values (threshold_1 ... threshold_T), and the method 600 returns to step 656, where it is determined whether each of the p consecutive $i^{th}$ order differential samples 345 is less than a current threshold value (threshold_2), which in the second iteration of step 656 is threshold_2. Steps 656, 658 and 659 continue to iterate until the values of the p consecutive $i^{th}$ order differential samples 345 have been compared against the last threshold value (threshold_T), and if the p consecutive $i^{th}$ order differential samples 345 do not fit within any of the threshold values (threshold_1 ... threshold_T), then the method 600 continues to step 690.

If one or more of the p consecutive $i^{th}$ order differential samples 345' are greater than or equal to each of the particular threshold values (threshold_1 ... threshold_T) (i.e., one or more of the p consecutive $i^{th}$ order differential samples 345' are not smaller than any of the threshold values (threshold_1 ... threshold_T)), then the p consecutive $i^{th}$ order differential samples 345' do not fit within at least one of the threshold values (threshold_1 ... threshold_T), and therefore compression of the p consecutive $i^{th}$ order differential samples 345' is not possible. Thus, if the current threshold value (threshold_1) used at step 656 is the last threshold value (threshold_T), then the method 600 proceeds to step 690.

At step 690, a default bit code ($bc_d$) is generated and a number (p) of consecutive raw data samples 305' are selected for framing and transmission, where p≦n. The value p can be predetermined based on the mode of operation, for example, by simulations. The default bit code ($bc_d$) 380 indicates that bit savings can not be increased by compressing the p consecutive $i^{th}$ order differential samples 345', and that the p consecutive $i^{th}$ order differential samples 345' can not be compressed. As such, the number (p) of consecutive raw data samples 305' are selected and no compression is performed.

At step 695, a regular frame 385 is created which includes the default bit code ($bc_d$) and the number (p) of consecutive raw data samples. The default bit code ($bc_d$) 380 indicates "raw data" is present in the frame 385 and that no compression has been performed on the number (p) of consecutive raw data samples 305'.

At step 697, the regular frame 385, which includes the default bit code ($bc_d$) and the number (p) of consecutive raw data sample 305', is transmitted to a data sink IC. When a data sink IC receives the frame 385, the data sink IC uses the default bit code ($bc_d$) 380 to determine that the frame 385 has not been compressed.

If each of the p consecutive $i^{th}$ order differential samples 345' is less than the current threshold value used at step 656, then it is determined that the p consecutive $i^{th}$ order differential samples 345' can be compressed (and hence that bit savings can be increased), and method 600 proceeds to step 660.

At step 660, a specific compression bit code ($bc_t$) is generated, and the p consecutive $i^{th}$ order differential samples 345' are selected for framing and transmission instead of the number (p) of consecutive raw data samples 305'. The specific compression bit code ($bc_t$) indicates that the p consecutive $i^{th}$ order differential samples 345' can be compressed. The specific compression bit code ($bc_t$) is generated for threshold t, where t is the smallest threshold value (out of the threshold_1, threshold_2, ... threshold_T) for which all of the p consecutive $i^{th}$ order differential samples 345' are smaller than threshold t. The specific compression bit code ($bc_t$) 375 indicates the smallest threshold t (out of threshold_1 threshold_2, ... threshold_T) for which all of the p consecutive $i^{th}$ order differential samples 345' are smaller than threshold t. The value of the specific compression bit code ($bc_t$) 375 for threshold t depends on the number of threshold values used by the threshold comparator module 350, and for a selected number of different threshold values there will be $2^{bc}$ possible bit codes, where bc is $\log_2 (T+1)$ bits required to represent all possible bc codes.

At step 670, dynamic compression techniques are applied to the p consecutive $i^{th}$ order differential samples 345'. Based on the specific compression bit code ($bc_t$), it is determined how many bits ($b_t$) are to be removed or "trimmed" from each of the p consecutive $i^{th}$ order differential samples 345', and a number of bits ($b_t$) are then removed or "trimmed" from each of the p consecutive $i^{th}$ order differential samples 345' to compress each of the p consecutive $i^{th}$ order differential samples 345' and generate the number (p) of consecutive compressed-differential samples 347'. In one implementation, a number of most significant bits (MSBs) are trimmed or removed from each of the p consecutive $i^{th}$ order differential samples 345' to generate a number (p) of consecutive compressed-differential samples 347'. The number (b) of bits required to represent each of the compressed-differential samples 347' is reduced in comparison to the number of bits required to represent each of the p consecutive $i^{th}$ order differential samples 345'. The number (p) of consecutive compressed-differential samples 347' includes only $b-b_t$ least significant bits (LSBs) for each of the p values. The value of each of consecutive compressed-differential samples 347' is represented using ($b-b_t$) total bits.

At step 680, a compressed frame 390 is generated which includes the specific compression bit code ($bc_t$) 375 for threshold t and for the amount of bit trimming $b_t$ applied for the number (p) of consecutive compressed-differential samples 347'.

At step 685, the compressed frame 390 is transmitted. The receiver of compressed frame 390 uses the specific compression bit code ($bc_t$) 375 to decompress the number (p) of consecutive compressed-differential samples 347'.

Exemplary Simulation of Differential Computation

Figure 7:
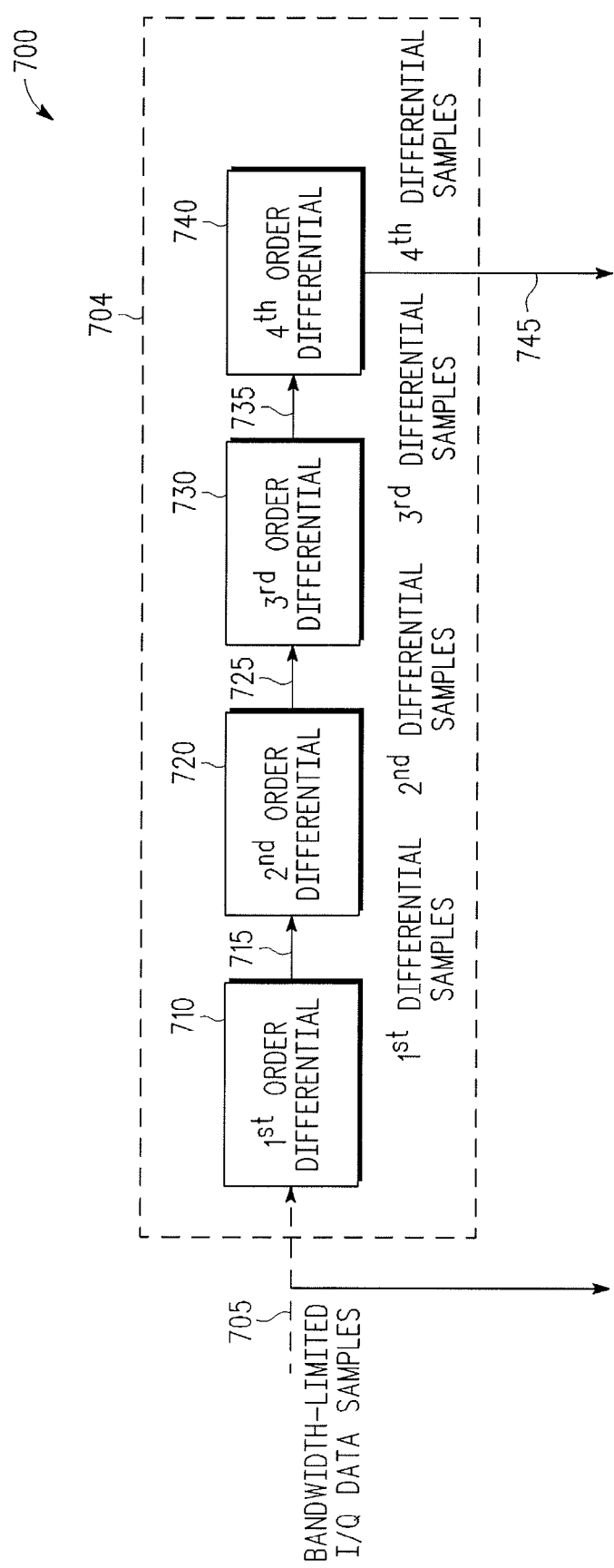
FIG. 7 is block diagram which illustrates a differential computation module in accordance with an exemplary implementation of the present invention.

To illustrate the concept of differential computation and the results of a differential computation, an example will now be described with reference to FIGS. 7 and 8A-8E. FIG. 7 is block diagram which illustrates a differential computation module 704 in accordance with an exemplary implementation of the present invention.

The differential computation module 704 comprises four differentiator modules 710-740 including a first differentiator module 710, a second differentiator module 720, a third differentiator module 730 and an $i^{th}$ differentiator module 740, where the variable (i) is equal to four (4), and therefore, the $i^{th}$ differentiator module 740 will be described below as a fourth differentiator module 740. In the particular implementation described below, in which the variable (i) is equal to four (4), the differential computation module 704 takes the first, second, third . . . $i^{th}$ order differential samples corresponding to the raw I/Q data samples of the bandwidth-limited GSM/EDGE data stream 705, and generates first, second, third . . . $i^{th}$ order differential samples 715, 725, 735, 745 of the raw I/Q data samples of the bandwidth-limited GSM/EDGE data stream 705. In other implementations, the variable (i) can be greater than four (4) in which case there may be more than four differentiator modules 710-740 in total, while in other implementations, the variable (i) can be less than four (4) in which case there may be fewer than four differentiator modules 710-740 in total.

Figure 8A:
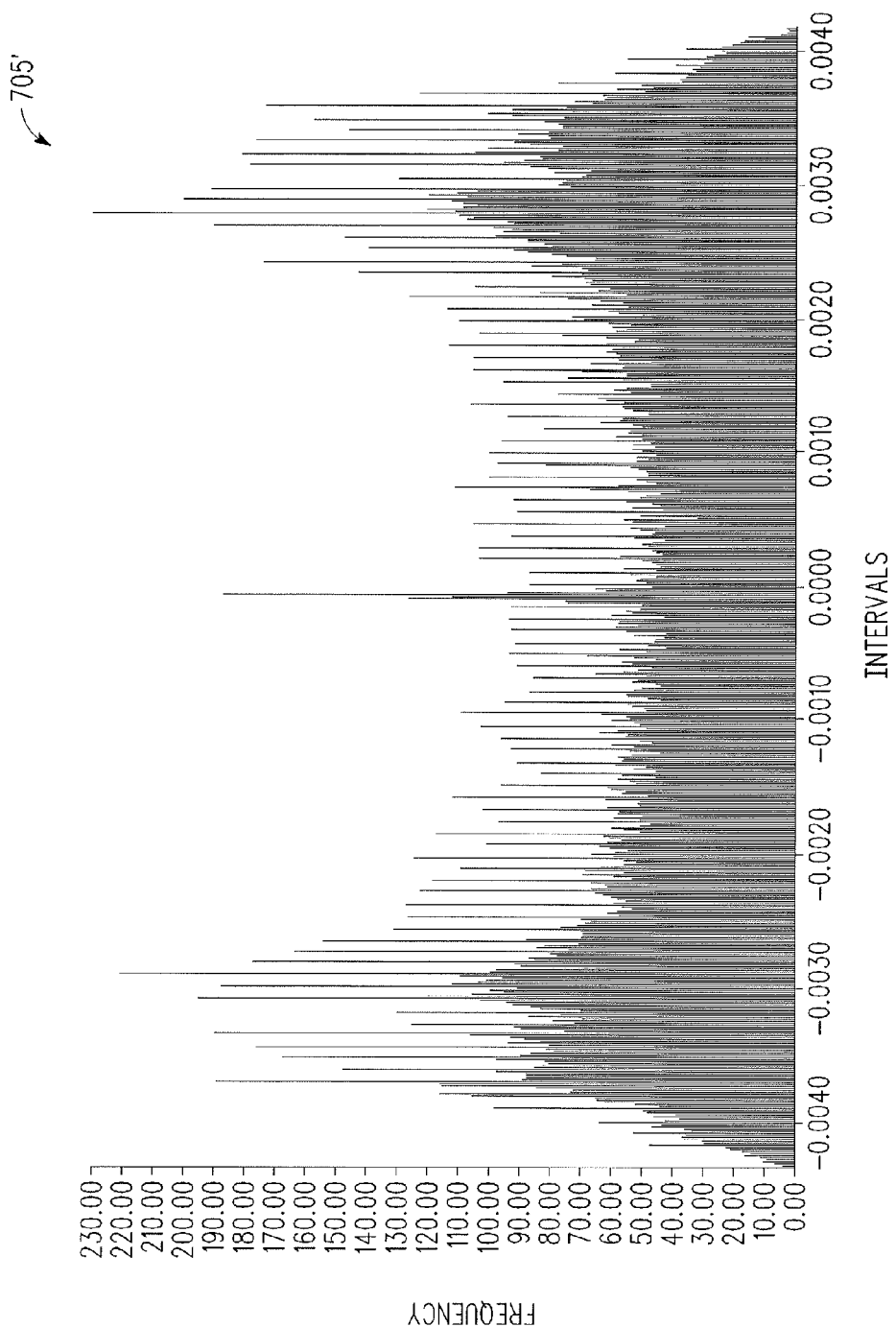
FIG. 8A is a histogram illustrating occurrence frequency and distribution of bandwidth-limited I channel data sample values.

In the following simulation, the differential computation module 704 receives the raw I/Q data samples of the bandwidth-limited GSM/EDGE data stream 705 from a data source (e.g., extracted from a complex RF signal, such as those from the band-limiting filter 118 of FIG. 2). The I/Q data stream 705 comprises digital bandwidth-limited I channel data samples, and digital bandwidth-limited Q channel data samples. FIG. 8A is a histogram 705' illustrating occurrence frequency and distribution of bandwidth-limited I channel data sample values. As illustrated in FIG. 8A, for GSM/EDGE modes of operation, the distribution 705' of bandwidth-limited I channel data samples is roughly flat over a large number of the raw, bandwidth-limited I channel data samples.

Figure 8B:
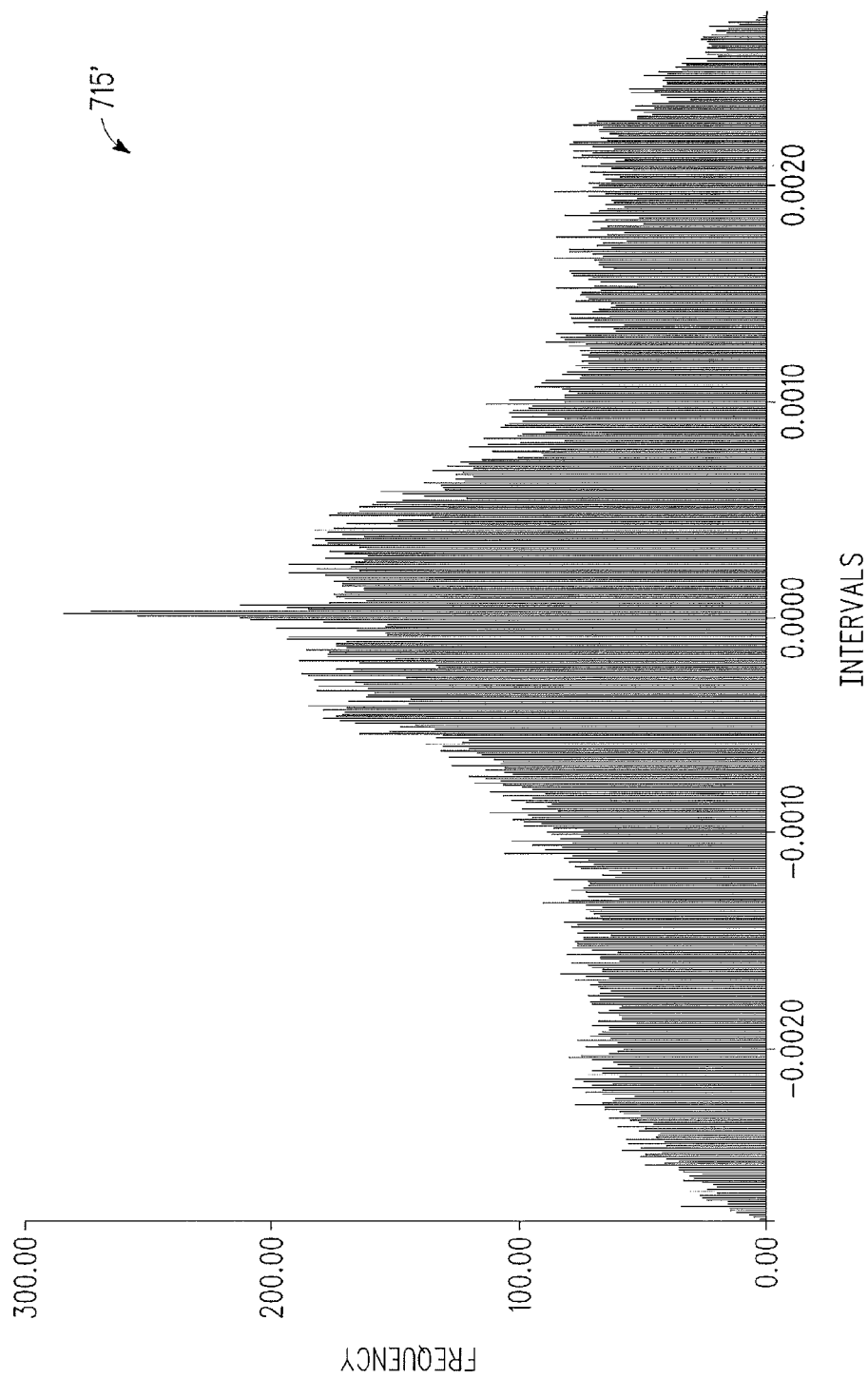
FIG. 8B is a histogram illustrating occurrence frequency and distribution of first order differential values of bandwidth-limited I channel data samples.

The first differentiator module 710 generates a first order differential data 715 representation of each of the raw I/Q data samples of the bandwidth-limited I/Q data stream 705, which is communicated to the second differentiator module 720. For instance, the first differentiator module 710 computes the first order differential of each of the raw I/Q data samples of the data stream 705 by calculating $d^1 I_{j+1} = I_{j+1} - I_j$ to generate a first order differential data 715 representation of each of the raw I/Q data samples of the bandwidth-limited I/Q data stream 705. FIG. 8B is a histogram 715' illustrating occurrence frequency and distribution of first order differential values of bandwidth-limited I channel data samples after taking a first order differential in accordance with an embodiment of the present invention. As illustrated in FIG. 8B, in contrast to FIG. 8A, the distribution of all $d^1 I$ shows heavier concentration or "relative percentage" of smaller I channel differential data sample values as compared to larger I channel differential data sample values.

Figure 8C:
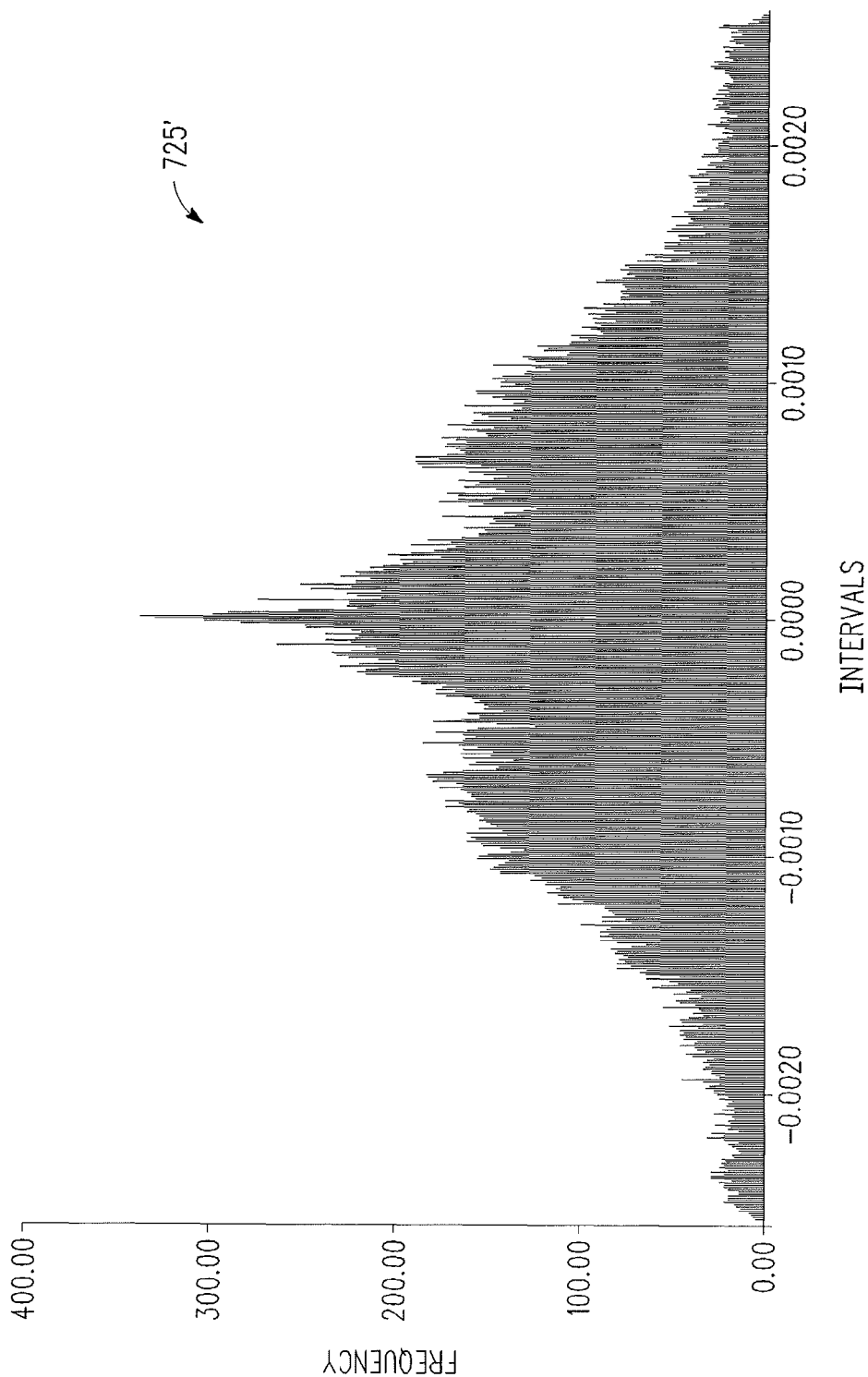
FIG. 8C is a histogram illustrating occurrence frequency and distribution of second order differential values of bandwidth-limited I channel data samples.

The second differentiator module 720 generates second order differential data 725 representation of the raw I/Q data samples of the bandwidth-limited I/Q data stream 705 based on the first order differential data 715, and communicates the second order differential data 725 to the third differentiator module 730. FIG. 8C is a histogram 725' illustrating occurrence frequency and distribution of second order differential values of bandwidth-limited I channel data samples after taking a second differential in accordance with an embodiment of the present invention. As illustrated in FIG. 8C, after the second differentiator module 720 computes the second order differential, the distribution of the second order differential data becomes closer to a normal or Gaussian distribution with higher roll-off.

Figure 8D:
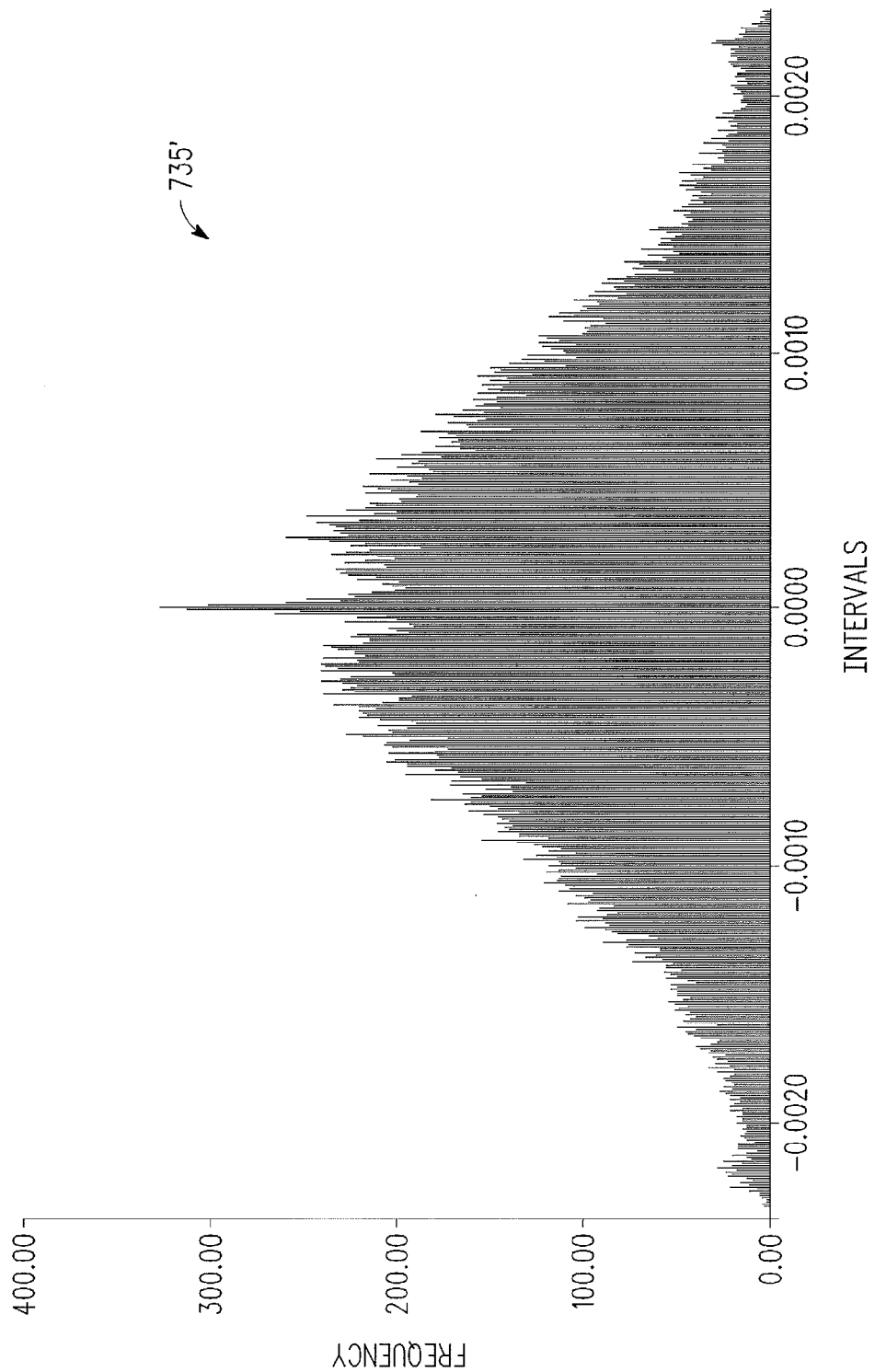
FIG. 8D is a histogram illustrating occurrence frequency and distribution of third order differential values of bandwidth-limited I channel data samples.

The third differentiator module 730 generates a third order differential data 735 representation of the raw I/Q data samples of the bandwidth-limited I/Q data stream 705 based on the second order differential data 725, and communicates the third order differential data to the fourth differentiator module 740. FIG. 8D is a histogram 735' illustrating occurrence frequency and distribution of third order differential values of bandwidth-limited I channel data samples after taking a third order differential in accordance with an embodiment of the present invention. As illustrated in FIG. 8D, after the third differentiator module 730 computes the third order differential data 735, the distribution of the third order differential data 735 becomes even closer to a normal or Gaussian behavior with even higher roll-off.

Figure 8E:
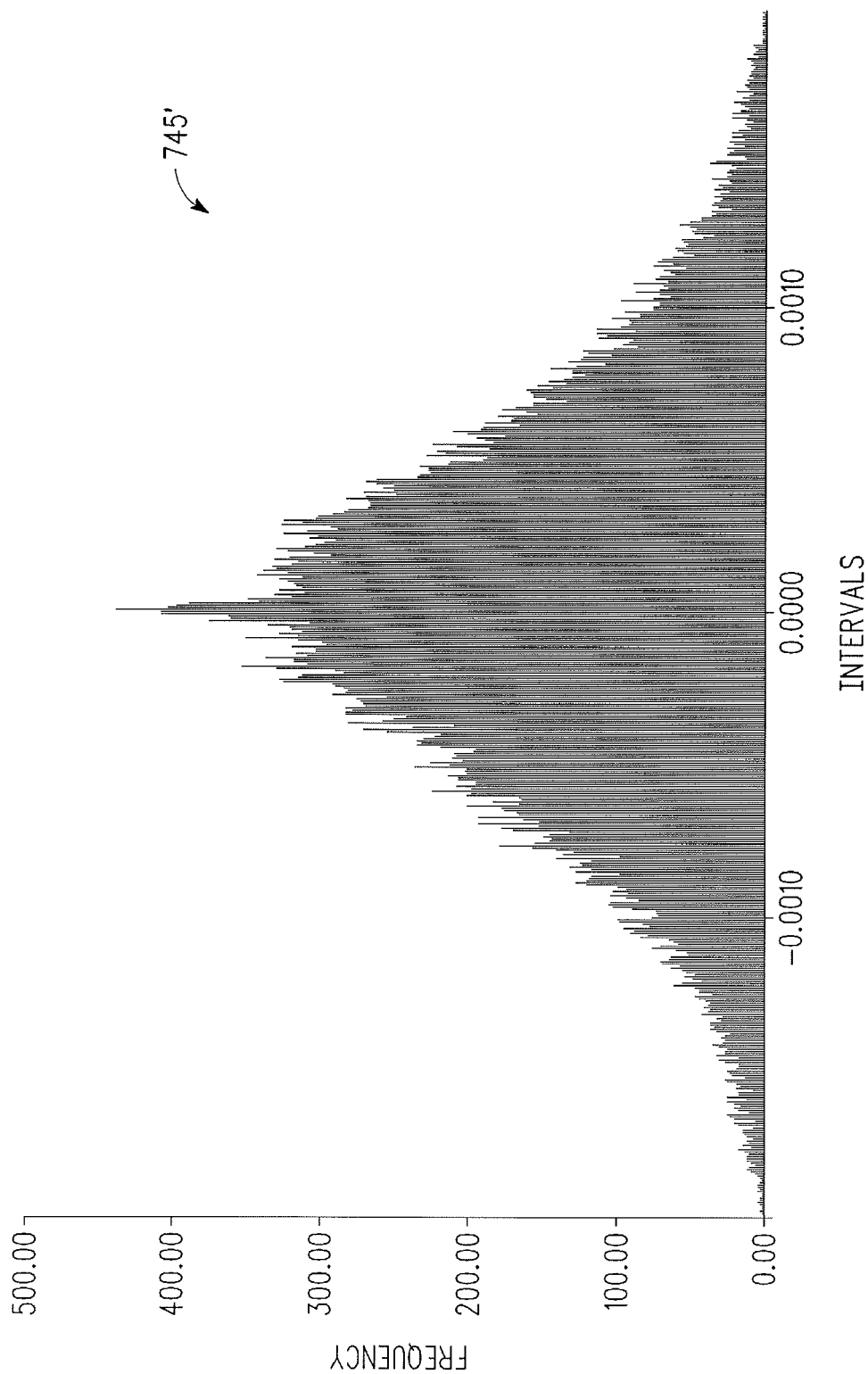
FIG. 8E is a histogram illustrating occurrence frequency and distribution of fourth order differential values of bandwidth-limited I channel data samples.

The fourth differentiator module 740 generates a fourth order differential data 745 representation of the raw I/Q data samples of the bandwidth-limited I/Q data stream 705 based on the third order differential data 735. FIG. 8E is a histogram 745' illustrating occurrence frequency and distribution of fourth order differential values of bandwidth-limited I channel data samples after taking a fourth order differential in accordance with an embodiment of the present invention. As illustrated in FIG. 8E, after the fourth differentiator module 740 computes the fourth order differential data 745, the distribution of the fourth order differential data 745 becomes still even closer to Gaussian behavior with yet even higher roll-off.

Exemplary Bit-Savings Achieved with Differential Dynamic Compression and Coding

FIG. 9 is a table of simulation results which illustrates the percentage (%) bit savings when different system variables are used in WCDMA operation mode and GSM/EDGE mode. FIG. 10 is a bar graph which illustrates the simulation results of FIG. 9 for WCDMA operation mode. FIG. 11 is a bar graph which illustrates other simulation results of FIG. 9 for GSM/EDGE operation mode. Although the simulation results of FIGS. 9-11 are preformed for WCDMA and GSM/EDGE operation modes, it will be appreciated that the bandwidth-limited data samples may comprise any known bandwidth-limited data samples, including those which are communicated in accordance with other known wireless communication standards including, but not limited to, LTE, 4G, WiMAX, etc.

Based on the simulations, ran over millions of I/Q samples, it becomes clear that the percentage of bit savings can vary depending on variables which include: the number (i) of differentiation modules, the number (p) of consecutive $i^{th}$ order differential samples which are selected, the number of threshold values (threshold_1 . . . threshold_T) that the p consecutive $i^{th}$ order differential samples are compared against, and the specific threshold values (threshold_1 . . . threshold_T) that are used for the comparison. Although not illustrated in FIGS. 9-11, changing other variables, such as the number (i) of differentiation modules, can also influence the percentage of bit savings.

For example, in the WCDMA mode of operation when i is equal to 4 (i=4), the number (p) of consecutive $i^{th}$ order differential samples is one (1), and the one (1) $i^{th}$ order differential sample is compared against threshold values of ½, ¼ and ¹⁄₆₄, the percentage of bit savings is 1.67%. By contrast, when the number (p) of consecutive $i^{th}$ order differential samples is eight (8), and the eight (8) $i^{th}$ order differential samples are compared against the same threshold values, the percentage of bit savings is 8.64%.

Similarly, in the GSM/EDGE mode of operation when i is equal to 4 (i=4), the number (p) of consecutive $i^{th}$ order differential samples is two (2), and the two (2) $i^{th}$ order differential samples are compared against threshold values of ½, ¼, ⅛, 1/16, 1/32 and 1/64, the percentage of bit savings is 3.92%, but when the number (p) of consecutive $i^{th}$ order differential samples is increased to four (4), and the four (4) $i^{th}$ order differential samples are compared against threshold values of ½, ¼ and 1/64, the percentage of bit savings is 9.95%.

Another factor that influences the percentage of bit savings is the nature of data being compressed. The bandwidth limiting performed on the data, and its sampling rate, for example, may also affect the percentage of bit savings.

Thus, by adding a negligible amount of information, significantly lesser numbers of bits are transmitted as compared to sending the raw bandwidth-limited data. Appropriate values for the different variables described above can be selected and/or predetermined to help reduce and/or minimize the total number of bits that are transferred over an interface and to reduce the overhead associated with code bits. By reducing the total number of bits being transferred, bandwidth is saved. In addition, current consumption can also be reduced because the total current consumption of pads, line driver, line receiver and all other supporting circuitry of a serial interface is directly proportional to the number of bits transferred.

While at least one example embodiment has been presented in the foregoing detailed description, it should be appreciated that a vast number of variations exist. It should also be appreciated that the example embodiment or embodiments described herein are not intended to limit the scope, applicability, or configuration of the claimed subject matter in any way. Rather, the foregoing detailed description will provide those skilled in the art with a convenient roadmap for implementing the described embodiment or embodiments. It should also be understood that various changes can be made in the function and arrangement of elements without departing from the scope defined by the claims, which includes known equivalents and foreseeable equivalents at the time of filing this patent application.

What is claimed is:

1. A method of processing a bandwidth-limited data stream which comprises a number (n) of bandwidth-limited data samples (1 . . . n), the method comprising:

receiving the bandwidth-limited data samples (1 . . . n), wherein values of each of the bandwidth-limited data samples require at most a first number of bits (b) to represent;

performing at least one differentiation operation on each of the bandwidth-limited data samples to generate a number (n) of $i^{th}$ order differential samples corresponding to the bandwidth-limited data samples (1 . . . n);

selecting a number (p) of consecutive $i^{th}$ order differential samples, wherein p≦n;

determining whether each of the values of the number (p) of consecutive $i^{th}$ order differential samples is representable using a second number ($b-b_t$) of bits that is less than the first number (b) of bits; and compressing the number (p) of consecutive $i^{th}$ order differential samples by removing a third number of bits ($b_t$) from each of the number (p) of $i^{th}$ order differential samples to generate a number (p) of consecutive compressed-differential samples, wherein a value of each of said compressed-differential samples is representable using at most the second number ($b-b_t$) of bits.

2. A method according to claim 1, further comprising the steps of:

generating a specific compression bit code ($bc_t$) which indicates the number of bits ($b_t$) to be removed from each of the number (p) of consecutive $i^{th}$ order differential samples when values of each of the number (p) of consecutive $i^{th}$ order differential samples are representable using the second number ($b-b_t$) of bits that is less than the first number (b) of bits;

selecting the number (p) of consecutive $i^{th}$ order differential samples for framing and transmission instead of the number (p) of consecutive raw data samples;

generating a compressed frame comprising the number (p) of consecutive compressed-differential samples and the specific compression bit code ($bc_t$); and transmitting the compressed frame over a serial interface.

3. A method according to claim 1, wherein the bandwidth-limited data samples are received from a data source, and further comprising the steps of:

receiving the compressed frame at a data sink.

4. A method according to claim 1, further comprising the steps of:

selecting a number (p) of consecutive ones of the bandwidth-limited data samples (1 . . . n) when a value of at least one of the number (p) of consecutive $i^{th}$ order differential samples is not representable using a second number ($b-b_t$) of bits that is less than the first number (b) of bits;

generating a default bit code ($bc_d$) which indicates that no bits are removed from the number (p) of bandwidth-limited data samples; and generating a frame comprising the number (p) of consecutive bandwidth-limited data samples and the default bit code ($bc_d$).

5. A method according to claim 1, wherein the step of determining whether each of the values of the number (p) of consecutive $i^{th}$ order differential samples is representable using a second number ($b-b_t$) of bits that is less than the first number (b) of bits, comprises the steps of:

dynamically determining whether each of the values of the number (p) of consecutive $i^{th}$ order differential samples is representable using a second number ($b-b_t$) of bits that is less than the first number (b) of bits such that values of each of the number (p) of $i^{th}$ order differential samples can be subsequently reduced by a number ($b_t$) of bits with respect to the first number (b) of bits required to represent corresponding values of each of a number (p) of the bandwidth-limited data samples.

6. A method according to claim 5, wherein a plurality of threshold values (threshold_1 . . . threshold_T) are provided such that when the values of each of the number (p) of consecutive $i^{th}$ order differential samples are less than a particular one of the threshold values (threshold_1 . . . threshold_T), the number (p) of consecutive $i^{th}$ order differential samples can be represented with $b-b_t$ bits, where b is the number of bits used to represent the value of any of a number (p) of the bandwidth-limited data samples (1 . . . p) and $b_t$ is an integer number of bits to be trimmed from each of the number (p) of the bandwidth-limited data samples (1 . . . p), and wherein the step of dynamically determining, comprises the steps of:

comparing a value of each of the number (p) of consecutive $i^{th}$ order differential samples to a current threshold value (threshold_1 ) of the plurality of threshold values (threshold_1 . . . threshold_T); and determining whether a value of each of the number (p) of consecutive $i^{th}$ order differential samples is less than the current threshold value to determine if each of the number (p) of consecutive $i^{th}$ order differential samples fits within the current threshold value (threshold_1 . . . threshold_T) without any loss.

7. A method according to claim 6, further comprising the steps of:

determining whether the current threshold value is a last threshold value (threshold_T) when one or more of the p consecutive $i^{th}$ order differential samples is greater than or equal to the current threshold value (threshold_1);

comparing the number (p) of consecutive $i^{th}$ order differential samples to a next current threshold value of the threshold values (threshold_1 ... threshold_T) when the current threshold value is not the last threshold value (threshold_T);

determining whether one or more of the number (p) of consecutive $i^{th}$ order differential samples is greater than or equal to the new current threshold value (threshold_2), when it is determined that the current threshold value is not the last threshold value (threshold_T); and determining whether the next current threshold value is the last threshold value (threshold_T) when one or more of the number (p) of consecutive $i^{th}$ order differential samples is greater than or equal to the new current threshold value (threshold_2).

8. A method according to claim 1, wherein the step of compressing the number (p) of consecutive $i^{th}$ order differential samples, comprises the steps of:

determining, based on the specific compression bit code ($bc_t$), the third number of bits ($b_t$) which are to be removed from each of the number (p) of consecutive $i^{th}$ order differential samples; and removing the third number of bits ($b_t$) from each of the number (p) of consecutive $i^{th}$ order differential samples to compress each of the number (p) of consecutive $i^{th}$ order differential samples and generate the number (p) of consecutive compressed-differential samples, wherein a value of each of said compressed-differential samples is representable using at most the second number ($b-b_t$) of bits such that the second number ($b-b_t$) of bits required to represent each of the compressed-differential samples is reduced in comparison to the first number (b) of bits required to represent a value of each of the number (p) of consecutive $i^{th}$ order differential samples and to represent a value of each of the bandwidth-limited data sample.

9. A method according to claim 1, wherein the bandwidth-limited data samples (1 ... n) comprise:

bandwidth-limited I/Q data samples (1 ... n).

10. A processor module designed to process a bandwidth-limited data stream which comprises a number (n) of bandwidth-limited data samples (1 ... n), the processor module comprising:

a differential computation module designed to perform at least one differentiation operation on each of the bandwidth-limited data samples (1 ... n) to generate a number (n) of $i^{th}$ order differential samples corresponding to the bandwidth-limited data samples (1 ... n), wherein values of each of the number (n) of bandwidth-limited data samples (1 ... n) require at most a first number of bits (b) to represent;

a dynamic compression and coding module, comprising:

a threshold comparator module designed to select a number (p) of consecutive $i^{th}$ order differential samples, wherein p≦n, and to determine whether each of the values of the number (p) of consecutive $i^{th}$ order differential samples is representable using a second number ($b-b_t$) of bits that is less than the first number (b) of bits; and a compression module designed to compress the number (p) of consecutive $i^{th}$ order differential samples by removing a third number of bits ($b_t$) from each of the number (p) of $i^{th}$ order differential samples to generate a number (p) of consecutive compressed-differential samples, wherein a value of each of said compressed-differential samples is representable using at most the second number ($b-b_t$) of bits.

11. A processor module according to claim 10, further comprising:

a bit code generator module designed to generate a specific compression bit code ($bc_t$) which indicates the number of bits ($b_t$) to be removed from each of the number (p) of consecutive $i^{th}$ order differential samples when values of each of the number (p) of consecutive $i^{th}$ order differential samples are representable using the second number ($b-b_t$) of bits that is less than the first number (b) of bits;

a first sample selector module designed to select the number (p) of consecutive $i^{th}$ order differential samples for framing and transmission instead of the number (p) of consecutive raw data samples; and a framing module designed to generate a compressed frame comprising the number (p) of consecutive compressed-differential samples and the specific compression bit code ($bc_t$), and to transmit the compressed frame over a serial interface coupled to a data sink.

12. A processor module according to claim 11, further comprising:

wherein the sample selector module is further designed to select a number (p) of consecutive ones of the bandwidth-limited data samples (1 ... n) when a value of at least one of the number (p) of consecutive $i^{th}$ order differential samples is not representable using a second number ($b-b_t$) of bits that is less than the first number (b) of bits;

wherein the bit code generator module is further designed to generate a default bit code ($bc_d$) which indicates that no bits are removed from the number (p) of bandwidth-limited data samples; and wherein the framing module is further designed to generate a frame comprising the number (p) of consecutive bandwidth-limited data samples and the default bit code ($bc_d$).

13. A processor module according to claim 10, wherein the threshold comparator module is further designed to: dynamically determine whether each of the values of the number (p) of consecutive $i^{th}$ order differential samples is representable using a second number ($b-b_t$) of bits that is less than the first number (b) of bits such that values of each of the number (p) of $i^{th}$ order differential samples can be subsequently reduced by a number ($b_t$) of bits with respect to the first number (b) of bits required to represent corresponding values of each of a number (p) of the bandwidth-limited data samples.

14. A processor module according to claim 13, wherein the threshold comparator module is further designed to:

receive a plurality of threshold values (threshold_1 ... threshold_T) such that when the values of each of the number (p) of consecutive $i^{th}$ order differential samples are less than a particular one of the threshold values (threshold_1 ... threshold_T), the number (p) of consecutive $i^{th}$ order differential samples can be represented with $b-b_t$ bits, where b is the number of bits used to represent the value of any of a number (p) of the bandwidth-limited data samples (1 ... p) and $b_t$ is an integer number of bits to be trimmed from each of the number (p) of the bandwidth-limited data samples (1 ... p); and compare a value of each of the number (p) of consecutive $i^{th}$ order differential samples to a current threshold value (threshold_1) of the plurality of threshold values (threshold_1 ... threshold_T), and determine whether a value of each of the number (p) of consecutive $i^{th}$ order differential samples is less than the current threshold value to determine if each of the number (p) of consecutive $i^{th}$ order differential samples fits within the current threshold value (threshold_1 ... threshold_T) without any loss.

15. A processor module according to claim 14, wherein the threshold comparator module is further designed to:
   determine whether the current threshold value is a last threshold value (threshold_T) when one or more of the p consecutive $i^{th}$ order differential samples is greater than or equal to the current threshold value (threshold_1);
   compare the number (p) of consecutive $i^{th}$ order differential samples to a next current threshold value of the threshold values (threshold_1 ... threshold_T) when the current threshold value is not the last threshold value (threshold_T), and determine whether one or more of the number (p) of consecutive $i^{th}$ order differential samples is greater than or equal to the new current threshold value (threshold_2) when it is determined that the current threshold value is not the last threshold value (threshold_T); and
   determine whether the next current threshold value is the last threshold value (threshold_T) when one or more of the number (p) of consecutive $i^{th}$ order differential samples is greater than or equal to the new current threshold value (threshold_2).

16. A processor module according to claim 10, wherein the compression module designed to determine the third number of bits ($b_t$) which are to be removed from each of the number (p) of consecutive $i^{th}$ order differential samples based on the specific compression bit code ($bc_t$), and to remove the third number of bits ($b_t$) from each of the number (p) of consecutive $i^{th}$ order differential samples to compress each of the number (p) of consecutive $i^{th}$ order differential samples and generate the number (p) of consecutive compressed-differential samples,
   wherein a value of each of said compressed-differential samples is representable using at most the second number ($b-b_t$) of bits such that the second number ($b-b_t$) of bits required to represent each of the compressed-differential samples is reduced in comparison to the first number (b) of bits required to represent a value of each of the number (p) of consecutive $i^{th}$ order differential samples and to represent a value of each of the bandwidth-limited data sample.

17. A processor module according to claim 10, wherein the bandwidth-limited data samples (1 ... n) comprise: bandwidth-limited I/Q data samples (1 ... n).

18. A system, comprising:
   a data source integrated circuit designed to generate a bandwidth-limited data stream which comprises a number (n) of bandwidth-limited data samples (1 ... n);
   a data sink integrated circuit; and
   a serial interface which couples the data source integrated circuit to the data sink integrated circuit,
   wherein one of the data source integrated circuit and the serial interface, comprise:
      a processor module designed to process the number (n) of bandwidth-limited data samples (1 ... n), the processor module comprising:
      a differential computation module designed to perform at least one differentiation operation on each of the bandwidth-limited data samples (1 ... n) to generate a number (n) of $i^{th}$ order differential samples corresponding to the bandwidth-limited data samples (1 ... n), wherein values of each of the number (n) of bandwidth-limited data samples (1 ... n) require at most a first number of bits (b) to represent;
      a dynamic compression and coding module, comprising:
         a threshold comparator module designed to select a number (p) of consecutive $i^{th}$ order differential samples, wherein $p \leq n$, and to determine whether each of the values of the number (p) of consecutive $i^{th}$ order differential samples is representable using a second number ($b-b_t$) of bits that is less than the first number (b) of bits; and
         a compression module designed to compress the number (p) of consecutive $i^{th}$ order differential samples by removing a third number of bits ($b_t$) from each of the number (p) of $i^{th}$ order differential samples to generate a number (p) of consecutive compressed-differential samples, wherein a value of each of said compressed-differential samples is representable using at most the second number ($b-b_t$) of bits.

19. A system according to claim 18, wherein the serial interface comprises:
   an asynchronous serial interface which complies with the DigRF standard.

20. A system according to claim 18, wherein the bandwidth-limited data samples (1 ... n) comprise: bandwidth-limited I/Q data samples (1 ... n), wherein the data source integrated circuit comprises a radio frequency integrated circuit, and wherein the data sink integrated circuit comprises a baseband integrated circuit.

21. An apparatus, comprising:
   a radio frequency integrated circuit designed to receive a downlink RF signal and to generate, based on the downlink RF signal, a bandwidth-limited data stream which comprises a number (n) of bandwidth-limited I/Q data samples (1 ... n);
   a baseband integrated circuit; and
   a serial interface which couples the baseband integrated circuit to the radio frequency integrated circuit, wherein one of the radio frequency integrated circuit and the serial interface, comprise:
      a differential computation module designed to perform at least one differentiation operation on each of the bandwidth-limited I/Q data samples (1 ... n) to generate a number (n) of $i^{th}$ order differential samples corresponding to the bandwidth-limited I/Q data samples (1 ... n), wherein values of each of the number (n) of bandwidth-limited I/Q data samples (1 ... n) require at most a first number of bits (b) to represent;
      a dynamic compression and coding module, comprising:
         a threshold comparator module designed to select a number (p) of consecutive $i^{th}$ order differential samples, wherein $p \leq n$, and to determine whether each of the values of the number (p) of consecutive $i^{th}$ order differential samples is representable using a second number ($b-b_t$) of bits that is less than the first number (b) of bits; and
         a compression module designed to compress the number (p) of consecutive $i^{th}$ order differential samples by removing a third number of bits ($b_t$) from each of the number (p) of $i^{th}$ order differential samples to generate a number (p) of consecutive compressed-differential samples, wherein a value of each of said compressed-differential samples is representable using at most the second number ($b-b_t$) of bits.

* * * * *